United States Patent
Kanner et al.

(10) Patent No.: US 9,631,838 B2
(45) Date of Patent: Apr. 25, 2017

(54) BOILER CONTROL COMPRISING ANALOG UP/DOWN TIMER CIRCUIT FOR GENERATING VARIABLE THRESHOLD SIGNAL

(71) Applicant: Martin Kanner, Plainview, NY (US)

(72) Inventors: Martin Kanner, Plainview, NY (US); Arthur Bauman, Smithtown, NY (US)

(*) Notice: Subject to any disclaimer, the term of this patent is extended or adjusted under 35 U.S.C. 154(b) by 0 days.

(21) Appl. No.: 15/017,054

(22) Filed: Feb. 5, 2016

(65) Prior Publication Data

US 2016/0223225 A1 Aug. 4, 2016

Related U.S. Application Data

(63) Continuation-in-part of application No. 14/613,505, filed on Feb. 4, 2015, now Pat. No. 9,287,770.

(60) Provisional application No. 62/386,930, filed on Dec. 16, 2015.

(51) Int. Cl.
| | |
|---|---|
| H04L 25/02 | (2006.01) |
| F24H 9/20 | (2006.01) |
| F24H 9/12 | (2006.01) |
| H03K 5/08 | (2006.01) |
| H03K 3/0231 | (2006.01) |

(52) U.S. Cl.
CPC ........... *F24H 9/2035* (2013.01); *F24H 9/122* (2013.01); *H03K 5/086* (2013.01); *H03K 3/0231* (2013.01)

(58) Field of Classification Search
CPC ............ H03K 19/00361; H04L 25/028; H04L 25/0272
USPC ..... 122/14.3, 451.2, 14.2; 137/87.01, 87.06; 700/275, 276
See application file for complete search history.

(56) References Cited

U.S. PATENT DOCUMENTS

| | | | |
|---|---|---|---|
| 3,821,650 A | | 6/1974 | Kase et al. |
| 3,831,117 A | | 8/1974 | Fletcher et al. |
| 3,987,764 A | | 10/1976 | Scofield |
| 4,483,479 A | * | 11/1984 | Snell ............ G05D 23/275 236/9 A |
| 4,692,598 A | | 9/1987 | Yoshida et al. |

(Continued)

FOREIGN PATENT DOCUMENTS

| | | |
|---|---|---|
| CA | 1064582 | 10/1979 |
| CN | 201314632 | 9/2009 |

(Continued)

*Primary Examiner* — Gregory A Wilson
(74) *Attorney, Agent, or Firm* — Ryan, Mason & Lewis, LLP

(57) ABSTRACT

An apparatus comprises a sensor circuit configured to detect activation of at least one circulator arranged to circulate liquid from a boiler through at least one circulation loop and back to the boiler. An analog up/down timer circuit has an input coupled to an output of the sensor circuit and generates a variable threshold signal that varies as a function of an activation time of the at least one circulator. A burner control circuit receives the variable threshold signal from the analog up/down timer circuit and generates an ignition control signal based at least in part on comparison of a temperature sensor signal of the boiler with the variable threshold signal. An ignition driver receives the ignition control signal from the burner control circuit and generates an ignition signal for a burner configured to burn fuel to heat the liquid in the boiler based at least in part on the ignition control signal.

20 Claims, 14 Drawing Sheets

(56) References Cited

U.S. PATENT DOCUMENTS

| | | |
|---|---|---|
| 4,710,861 A | 12/1987 | Kanner |
| 4,921,163 A * | 5/1990 | Viessmann .......... G05D 23/1917 |
| | | 236/46 R |
| 4,922,906 A | 5/1990 | Takeuchi et al. |
| 5,055,825 A * | 10/1991 | Yang .................. B60H 1/00978 |
| | | 165/11.1 |
| 5,442,157 A * | 8/1995 | Jackson ................ F24H 9/2035 |
| | | 219/483 |
| 5,585,752 A | 12/1996 | Botti et al. |
| 5,692,676 A | 12/1997 | Walker |
| 5,757,223 A | 5/1998 | Nevin |
| 5,775,582 A | 7/1998 | Hammer |
| 5,780,904 A | 7/1998 | Konishi et al. |
| 5,898,328 A * | 4/1999 | Shoji ..................... H03L 7/0891 |
| | | 327/147 |
| 5,900,771 A | 5/1999 | Bremner |
| 5,945,870 A | 8/1999 | Chu et al. |
| 6,194,903 B1 | 2/2001 | Schulz |
| 6,344,772 B1 | 2/2002 | Larsson |
| 7,382,634 B2 | 6/2008 | Buchmann |
| 7,902,928 B2 | 3/2011 | Wang |
| 8,629,700 B2 | 1/2014 | Feng et al. |
| 8,844,834 B1 | 9/2014 | Lyons et al. |
| 2005/0077858 A1 * | 4/2005 | Kuribayashi ...... B60H 1/00835 |
| | | 318/625 |
| 2006/0244545 A1 | 11/2006 | Briskin et al. |
| 2008/0055808 A1 | 3/2008 | Burkland et al. |
| 2009/0001186 A1 | 1/2009 | Cohen |
| 2010/0122668 A1 * | 5/2010 | Ando .................... F24H 9/2035 |
| | | 122/14.3 |
| 2010/0315154 A1 | 12/2010 | Tang |
| 2012/0090560 A1 * | 4/2012 | Iwama .................... F24H 1/145 |
| | | 122/14.3 |
| 2014/0070014 A1 | 3/2014 | Bohan et al. |
| 2014/0266755 A1 * | 9/2014 | Arensmeier ......... F24F 11/0086 |
| | | 340/679 |
| 2016/0187028 A1 * | 6/2016 | Shimada ............... F24H 9/2035 |
| | | 122/14.21 |

FOREIGN PATENT DOCUMENTS

| | | |
|---|---|---|
| CN | 203014674 U | 6/2013 |
| CN | 204285827 | 4/2015 |
| GB | 1437544 | 5/1976 |
| GB | 1449243 | 9/1976 |
| JP | S57182684 A | 11/1982 |
| JP | S5997223 A | 6/1984 |
| JP | 2006080594 A | 3/2006 |
| JP | 2008203098 A | 9/2008 |
| JP | 2009147604 A | 7/2009 |
| KR | 910005608 B1 | 7/1991 |
| WO | 2014090136 A1 | 6/2014 |

* cited by examiner

BOILER CONTROL COMPRISING ANALOG UP/DOWN TIMER CIRCUIT FOR GENERATING VARIABLE THRESHOLD SIGNAL

RELATED APPLICATIONS

The present application is a continuation-in-part of U.S. patent application Ser. No. 14/613,505, filed Feb. 4, 2015 and entitled "Analog Timer Circuit with Time Constant Multiplication Effect," which is incorporated by reference herein. The present application also claims the priority of U.S. Provisional Patent Application Ser. No. 62/386,930, filed Dec. 16, 2015 and entitled "High Reliability Energy Saving Hot Water Boiler Control," which is incorporated by reference herein.

FIELD

The field relates generally to electronic circuitry, and more particularly to electronic control circuitry.

BACKGROUND

A wide variety of different types of electronic control circuitry are known. These include, for example, boiler controls for hot water heating systems. A typical hot water boiler control utilizes a switch responsive to an output signal from a boiler water temperature sensor to control burner fuel supply and ignition. The boiler water temperature sensor may comprise a heat sensitive capillary tube inserted into an enclosed well in the hot water boiler. The hot water heating system further comprises a room or area thermostat that is used to control a circulator. The circulator is configured to circulate hot water from the boiler through hot water radiators associated with the room or area in order to maintain a desired room or area temperature.

In these and other typical boiler controls, temperature settings of the switch that controls burner fuel supply and ignition are confined to a relatively narrow range selected to accommodate the coldest outside temperature that is likely to be experienced. More particularly, the temperature settings generally must be high enough for the coldest outdoor conditions likely to be experienced so that the hot water radiators will be capable of providing a comfortable room or area temperature under those conditions. However, at higher boiler temperatures there is greater heat loss, greater fuel usage and greater greenhouse emissions. Since outside temperatures vary throughout the year, it is advantageous and more efficient for boiler temperatures to be reduced as outside temperatures increase. Comfortable room or area temperatures can be maintained using significantly reduced boiler temperatures in the presence of higher outdoor temperatures. This is especially important during spring, summer and fall times when the boiler is not used for heating but merely to provide hot water via its internal hot water heat exchangers. Under these conditions, high boiler temperatures are not needed, are particularly inefficient and unnecessarily produce excessive greenhouse emissions.

A number of different approaches attempt to address the inefficiencies associated with maintaining unduly high boiler temperatures. For example, some of these approaches involve measuring the outside temperature and reducing boiler temperature as the outside temperature increases. Other approaches involve comparing the measured temperature of the water leaving the boiler and going to the hot water radiators to the measured temperature of the water returning to the boiler from the hot water radiators, and reducing boiler temperature as the difference between the measured temperatures decreases.

Although these techniques can be effective, they suffer from a number of significant drawbacks. For example, some techniques require the addition of outdoor temperature sensors or the utilization of complex digital data processors and associated software. This adds excessive cost to the boiler control and to its installation. This also increases the number of boiler control failure modes. For example, single point failures of critical components can cause a temperature runaway condition in the boiler.

SUMMARY

Illustrative embodiments of the present invention provide electronic control circuitry particularly well suited for use with a hot water boiler. For example, some embodiments provide boiler control circuitry in which boiler temperature is automatically reduced as outside temperature increases without the need for outdoor temperature sensors or complex digital data processor controls. Furthermore, some embodiments incorporate dual boiler temperature sensing, fault detection and associated multiple burner ignition relays in order to greatly enhance reliability and prevent boiler temperature runaway conditions.

These and other embodiments advantageously provide a boiler control that exhibits exceptionally high reliability at low cost and without the other drawbacks of the conventional arrangements described previously. Such a boiler control can significantly reduce fuel consumption and associated greenhouse emissions for both home and commercial heating systems, and in other applications.

In one embodiment, an apparatus comprises a sensor circuit, an analog up/down timer circuit, a burner control circuit and an ignition driver. The sensor circuit is configured to detect activation of at least one circulator arranged to circulate liquid from a boiler through at least one circulation loop and back to the boiler. For example, there may be a plurality of circulators and the sensor circuit may illustratively comprise a current sense circuit arranged in series with respective alternating-current control lines of the plurality of circulators.

The analog up/down timer circuit in this particular embodiment has an input coupled to an output of the sensor circuit and is configured to generate a variable threshold signal that varies as a function of an activation time of said at least one circulator. The burner control circuit is configured to receive the variable threshold signal from the analog up/down timer circuit and to generate an ignition control signal based at least in part on comparison of a temperature sensor signal of the boiler with the variable threshold signal. The ignition driver is configured to receive the ignition control signal from the burner control circuit and to generate an ignition signal for a burner configured to burn fuel to heat the liquid in the boiler based at least in part on the ignition control signal.

By way of example, the analog up/down timer circuit may illustratively comprise a pulse source, a charge storage element, a charge pump coupled between the pulse source and the charge storage element, and a discharge pump coupled between the pulse source and the charge storage element. In such an arrangement, a pulse signal generated by the pulse source is illustratively utilized to charge the charge storage element via the charge pump in a charge mode of operation for a period of time for which at least one of a plurality of circulators is activated and to discharge the charge storage element via the discharge pump in a discharge mode of operation for a period of time for which none of the plurality of circulators is activated. The analog up/down timer circuit may be configured in a particular one of the charge and discharge modes of operation responsive to an up/down control signal generated by the sensor circuit. Additionally, the charge pump and the discharge pump may be driven by respective ones of complemented and uncomplemented versions of the pulse signal generated by the pulse source.

In some embodiments, a boiler control comprises a dual boiler sense circuit, with the dual boiler sense circuit comprising a first temperature sensor configured to generate the temperature sensor signal as a first temperature sensor voltage, and a second temperature sensor configured to generate a second temperature sensor voltage. Such embodiments may further comprise a fault detection circuit configured to monitor the first and second temperature sensor voltages and to generate a fault indication signal if the first and second temperature sensor voltages differ from one another by more than a designated amount.

In some embodiments, the ignition driver illustratively comprises a first relay circuit configured to control a state of a first switch arranged in series with an alternating-current control line of the burner based at least in part on the ignition signal. Such embodiments may further comprise a fault driver, with the fault driver comprising a second relay circuit configured to control a state of a second switch arranged in series with the first switch and the alternating-current control line of the burner based at least in part on a fault indication signal generated by a fault detection circuit.

Other embodiments include, by way of example and without limitations, boiler control methods as well as heating systems that comprise boiler control circuitry.

Electronic control circuitry in other embodiments can be implemented in a wide variety of other control system applications. Such electronic control circuitry may but need not comprise an analog timer circuit.

DETAILED DESCRIPTION

Figure 1:
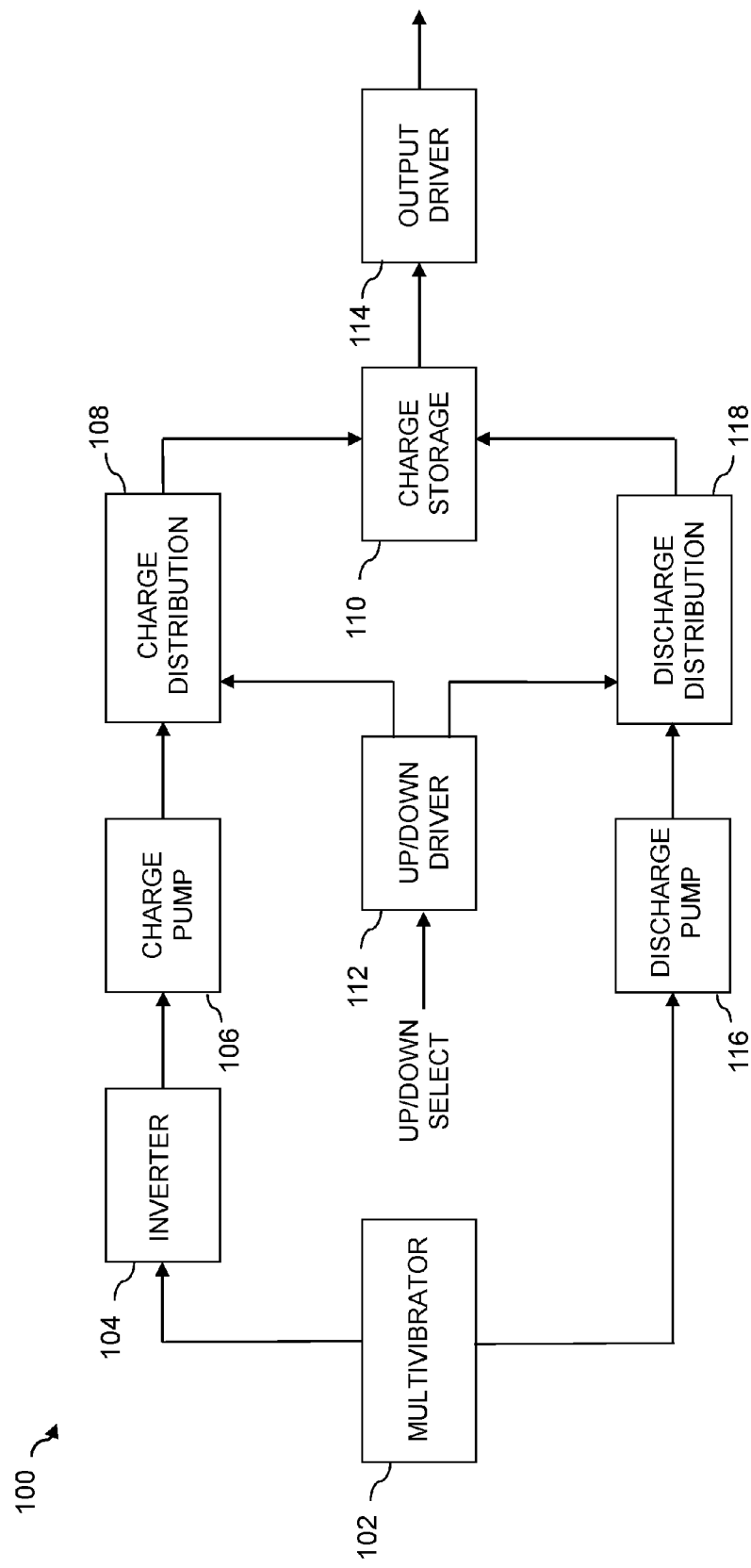
FIG. 1 is a block diagram of an analog timer circuit in an illustrative embodiment of the invention.

Illustrative embodiments of the present invention will be described herein with reference to examples of analog timer circuits and other types of electronic control circuitry, as well as systems that incorporate such electronic control circuitry. It is to be appreciated, however, that embodiments of the invention are not restricted to use with the particular illustrative circuit and system configurations shown. For example, those skilled in the art will recognize that numerous alternative electronic control circuitry configurations can be implemented utilizing the teachings provided herein. Moreover, embodiments of the invention are not limited to the particular control systems shown, but are more generally applicable to any type of system in which it is desirable to provide enhanced control functionality. Accordingly, the term "system" as used herein is intended to be broadly construed so as to encompass a wide variety of different devices or arrangements of multiple devices of the type disclosed herein.

Some embodiments of the invention utilize analog timer circuits of the type disclosed in the above-cited U.S. patent application Ser. No. 14/613,505. For example, hot water boiler control circuitry that incorporates one possible implementation of an analog timer circuit will be described below in conjunction with FIGS. 5, 6 and 7. It is to be appreciated, however, that other hot water boiler control circuitry embodiments of the invention need not utilize analog timer circuits. Examples of such embodiments will be described in detail below in conjunction with FIGS. 9 through 14.

Before describing the hot water boiler control circuitry embodiments, example analog timer circuit embodiments will be described with reference to FIGS. 1 through 4.

It should initially be noted that a wide variety of electronic timer circuits are known in the art, including both analog timer circuits and digital timer circuits. Conventional analog timer circuits based on resistor-capacitor (RC) time constants are advantageous in that such circuits can be configured to provide a substantially continuous analog output and thus a large number of possible set points. However, such analog timer circuits can be problematic in applications in which relatively long time constants, on the order of tens, hundreds or thousands of seconds, are needed, as large and costly capacitors can be required.

Digital timer circuits based on digital counters overcome some of the disadvantages of analog timer circuits. For example, digital timer circuits can provide relatively long time constants. However, such digital timer circuits exhibit only a limited number of set points, corresponding to respective predetermined discrete output times, as compared to the much larger number of set points provided by the continuous analog output of an analog timer circuit. Moreover, digital timer circuits are generally more complex than analog timer circuits, and some of the digital circuit elements can be very costly.

Various techniques are also known for increasing the effective capacitance value of a given capacitive element. For example, the well-known Miller effect provides an increase in the effective capacitance of a given capacitor when the capacitor is used as a negative feedback element in a grounded-emitter bipolar transistor amplifier. In this configuration, the increase in effective capacitance approaches the current gain or beta of the transistor. A similar increase in effective capacitance can be achieved in an emitter-follower circuit in which the capacitor is connected between the base and collector of the bipolar transistor. As the maximum beta value for a bipolar transistor is typically about 100, the increase in effective capacitance in these and other similar conventional arrangements is at most about 100:1, which is generally insufficient to overcome the above-noted issues arising in conventional analog timer circuits based on RC time constants.

Illustrative embodiments of the present invention provide simple and inexpensive analog timer circuits that exhibit an advantageous time constant multiplication effect. For example, a given embodiment can provide a long time constant, on the order of tens, hundreds or thousands of seconds, using a much smaller capacitance value than would be required in a conventional analog timer circuit based on a corresponding RC time constant. More particularly, in some of the illustrative embodiments, a time constant multiplication factor of up to 5000:1 or more is provided, such that an analog timer circuit providing relatively long time constants can be implemented using inexpensive components. Circuit reliability is also enhanced by the application of relatively low impedance circuit elements while achieving long time constants.

In one embodiment, an analog timer circuit comprises a pulse source, a charge storage element, and a charge pump coupled between the pulse source and the charge storage element. A pulse signal generated by the pulse source is utilized to charge the charge storage element via the charge pump.

The pulse signal may comprise an asymmetric pulse signal, with a charge time constant of the analog timer circuit being controllable through adjustment of at least one of a frequency and an asymmetry of the pulse signal.

The charge pump and charge storage element may comprise respective capacitive elements, with the charge time constant of the analog timer circuit being controllable through adjustment of relative capacitance values of the respective capacitive elements of the charge pump and the charge storage element.

The analog timer circuit may further comprise a charge distribution circuit coupled between the charge pump and the charge storage element. The charge distribution circuit comprises first and second circuit paths separating energy from the charge pump into respective first and second portions, with the first circuit path providing the first portion of the charge pump energy to the charge storage element, and the second circuit path diverting the second portion of the charge pump energy away from the charge storage element. In such an arrangement, the charge time constant of the analog timer circuit is controllable through adjustment of relative distribution of the charge pump energy between the first and second circuit paths.

The analog timer circuit may further comprise a discharge pump coupled between the pulse source and the charge storage element, with the pulse signal generated by the pulse source also being utilized to discharge the charge storage element via the discharge pump. For example, the charge pump and the discharge pump may be driven by respective ones of complemented and uncomplemented versions of the pulse signal generated by the pulse source.

Time constant adjustment mechanisms similar to those described above for the charge time constant may be provided in an analogous manner for a discharge time constant of the analog timer circuit.

An up/down driver circuit may be provided to select between charging of the charge storage element via the charge pump and discharging of the charge storage element via the discharge pump.

Other embodiments include, by way of example and without limitation, systems that implement feedback control utilizing an analog timer circuit.

Illustrative embodiments of analog timer circuits as disclosed herein can provide significant advantages relative to conventional arrangements. For example, relatively long time constants can be provided using low capacitance and resistance values, and thus with significantly less cost and complexity than would otherwise be required. Also, an analog timer circuit in a given embodiment can be configured to allow for thousands of set points as compared to the limited number of outputs from a digital timer circuit.

FIG. 1 shows a block diagram of an analog timer circuit 100 in one embodiment. The analog timer circuit 100 comprises an astable multivibrator 102 that is coupled via an inverter 104 to a charge pump 106. The analog timer circuit 100 further comprises a charge distribution circuit 108, a charge storage element 110, an up/down driver circuit 112, an output driver 114, a discharge pump 116 and a discharge distribution circuit 118.

The analog timer circuit 100 is advantageously configured to allow a given capacitive element comprising the charge storage element 110 to perform as if it were a much larger capacitive element. Accordingly, much longer time constants can be provided than would otherwise be possible using the given capacitive element. For example, it is possible in some embodiments to provide as much as a 5000 times increase or more in time constant length over that provided using a corresponding equivalent RC time constant arrangement. Embodiments of the invention therefore extend the time constant achievable using a given capacitive element by multiple orders of magnitude relative to conventional analog timer circuits based on RC time constants.

The analog timer circuit 100 is configured as an up/down timer circuit, in that it can selectively provide timing functionality based on charging of the charge storage element 110 and discharging of the charge storage element 110 in respective charge and discharge modes of operation of the analog timer circuit 100.

The up/down driver circuit 112 is configured to select between charging of the charge storage element 110 via the charge pump 106 and discharging of the charge storage element 110 via the discharge pump 116, responsive to an up/down select signal. More particularly, the up/down driver circuit 112 prevents the discharge pump energy from being delivered by the discharge distribution circuit 118 to the charge storage element 110 in the charge mode of operation, and prevents the charge pump energy from being delivered by the charge distribution circuit 108 to the charge storage element 110 in the discharge mode of operation, thereby controlling whether the charge on the charge storage element 110 will increase or decrease.

The output driver 114 is configured as an isolation driver which presents a high input impedance to the charge storage element 110 to prevent loading of the corresponding capacitive element. The output driver 114 also provides a low direct current (DC) output impedance for the analog timer circuit 100.

The output driver 114 in the present embodiment provides a substantially continuous analog output that can be slowly increasing or slowly decreasing, depending upon the selected charge or discharge mode of operation, and in accordance with the configured charge or discharge time constant.

By way of example, the output of the analog timer circuit 100 can be used in applications in which a control event is to be initiated after a relatively long delay. The output of the analog timer circuit can be compared to a preselected DC level and after the long delay the designated control event is initiated.

It is to be appreciated, however, that other types of analog timer circuit outputs can be provided in other embodiments.

A pulse signal generated by the astable multivibrator 102 is utilized to charge the charge storage element 110 via the charge pump 106, and to discharge the charge storage element 110 via the discharge pump 116. The astable multivibrator 102 is an example of what is more generally referred to herein as a "pulse source." Numerous other types of pulse sources may be used in other embodiments, such as, for example, a pulse generator.

The charge pump 106 and the discharge pump 116 in some embodiments are implemented as respective voltage source electrical energy pumps each comprising a single capacitive element, although numerous other types of charge and discharge pumps can be used in other embodiments. Charge and discharge pumps implemented using respective single capacitive elements are also referred to herein as capacitor charge pumps and capacitor discharge pumps, respectively.

Possible alternatives to the capacitor charge and discharge pumps utilized in certain embodiments include, for example, inductive charge or discharge pumps, in which energy from pulses of a pulse signal is inductively delivered to or removed from the charge storage element 110. Other arrangements involving provision of pulse energy to or from the charge storage element 110 can be used.

The pulse signal generated by the multivibrator 102 illustratively comprises an asymmetric pulse signal. More particularly, the pulse signal is assumed to comprise an asymmetric square wave. Other types of pulse signals can be used in other embodiments.

In the present embodiment, a charge time constant of the analog timer circuit 100 is controllable through adjustment of at least one of a frequency and an asymmetry of the pulse signal generated by the multivibrator 102.

The inverter 104 has its input coupled to an output of the multivibrator 102. The inverter 104 receives at its input an uncomplemented version of the pulse signal generated by the multivibrator 102 and provides at its output a complemented version of the pulse signal. Accordingly, the input of the charge pump 106 in this embodiment is driven by the complemented version of the pulse signal.

The charge pump 106 and the charge storage element 110 illustratively comprise respective capacitive elements.

The above-noted charge time constant of the analog timer circuit 100 is further controllable through adjustment of relative capacitance values of the respective capacitive elements of the charge pump 106 and the charge storage element 110.

Additional control of the charge time constant of the analog timer circuit 100 is provided by adjustment of the charge distribution circuit 108. For example, the charge distribution circuit 108 may comprise first and second circuit paths separating energy from the charge pump 106 into respective first and second portions, with the first circuit path providing the first portion of the charge pump energy to the charge storage element 110, and the second circuit path diverting the second portion of the charge pump energy away from the charge storage element 110. In one implementation of such an arrangement, the charge distribution circuit 108 illustratively dissipates part of the energy received from the charge pump 106 and feeds the remaining received charge pump energy to the charge storage element 110.

The charge time constant of the analog timer circuit 100 is then controllable through adjustment of relative distribution of the charge pump energy between the first and second circuit paths.

Accordingly, the charge time constant in the analog timer circuit 100 is controllable through adjustment of one or more of the following:

1. Frequency of the pulse signal generated by the multivibrator 102.

2. Asymmetry of the pulse signal generator by the multivibrator 102.

3. Relative capacitance values of the respective capacitive elements of the charge pump 106 and the charge storage element 110.

4. Relative distribution of the charge pump energy between the first and second circuit paths of the charge distribution circuit 108.

It is to be appreciated that a given embodiment may provide only a subset of the adjustability mechanisms described above, and possibly additional or alternative adjustment mechanisms.

A discharge time constant of the analog timer circuit 100 is controllable in a manner similar to that described above for the charge time constant.

More particularly, in this embodiment the charge pump 106 and the discharge pump 116 are driven by respective complemented and uncomplemented versions of the pulse signal generated by the multivibrator 102.

As a result, the discharge time constant of the analog timer circuit 100 is also controllable through adjustment of at least one of a frequency and an asymmetry of the pulse signal generated by the multivibrator 102.

It should be noted that the inverter 104 can instead be arranged between the multivibrator 102 and the discharge pump 116, rather than between the multivibrator 102 and the charge pump 106 as in the FIG. 1 embodiment, such that the charge pump and discharge pump are driven by respective uncomplemented and complemented versions of the pulse signal generated by the multivibrator 102.

Like the charge pump 106, the discharge pump 116 may comprise a capacitive element. The discharge time constant of the analog timer circuit 100 is then controllable through adjustment of relative capacitance values of the respective capacitive elements of the discharge pump 116 and the charge storage element 110.

Like the charge distribution circuit 108, the discharge distribution circuit 118 illustratively comprises first and second circuit paths separating energy from the discharge pump 116 into respective first and second portions, with the first circuit path providing the first portion of the discharge pump energy to the charge storage element 110, and the second circuit path diverting the second portion of the discharge pump energy away from the charge storage element 110. In one implementation of such an arrangement, the discharge distribution circuit 118 illustratively dissipates part of the energy received from the discharge pump 116 and feeds the remaining received discharge pump energy to the charge storage element 110.

The discharge time constant of the analog timer circuit 100 is then controllable through adjustment of relative distribution of the discharge pump energy between the first and second circuit paths.

Again, other embodiments can utilize only a subset of the particular adjustment mechanisms described above for controlling the discharge time constant of the analog timer circuit 100.

It should also be understood that the particular set of components implemented in the analog timer circuit 100 as illustrated in FIG. 1 are presented by way of example only. In other embodiments, only subsets of these components, or additional or alternative sets of components, may be used, and such components may exhibit alternative functionality and configurations.

For example, although configured in the FIG. 1 embodiment as an up/down timer, the analog timer circuit 100 in other embodiments can be reconfigured as an up-only timer by eliminating the up/down driver circuit 112, the discharge pump 116 and the discharge distribution circuit 118, and providing a reset mechanism for discharging the charge storage element 110 after a charging threshold is reached. Similarly, the analog timer circuit 100 in other embodiments can be reconfigured as a down-only timer by eliminating the up/down driver circuit 112, the charge pump 106 and the charge distribution circuit 108, and providing a reset mechanism for charging the charge storage element 110 after a discharging threshold is reached.

It should be noted in this regard that the term "analog timer circuit" as used herein is intended to be broadly construed, so as to encompass, for example, any timer circuit arrangement in which the primary timing mechanism is based on a substantially continuous analog signal. Accordingly, it is possible that a given analog timer circuit as disclosed herein may include a certain minimal number of digital components, such as, for example, digital switches for controlling switching between charge and discharge modes of operation, but such an analog timer circuit does not utilize digital timing circuitry such as digital counters for its primary timing mechanism.

Figure 2:
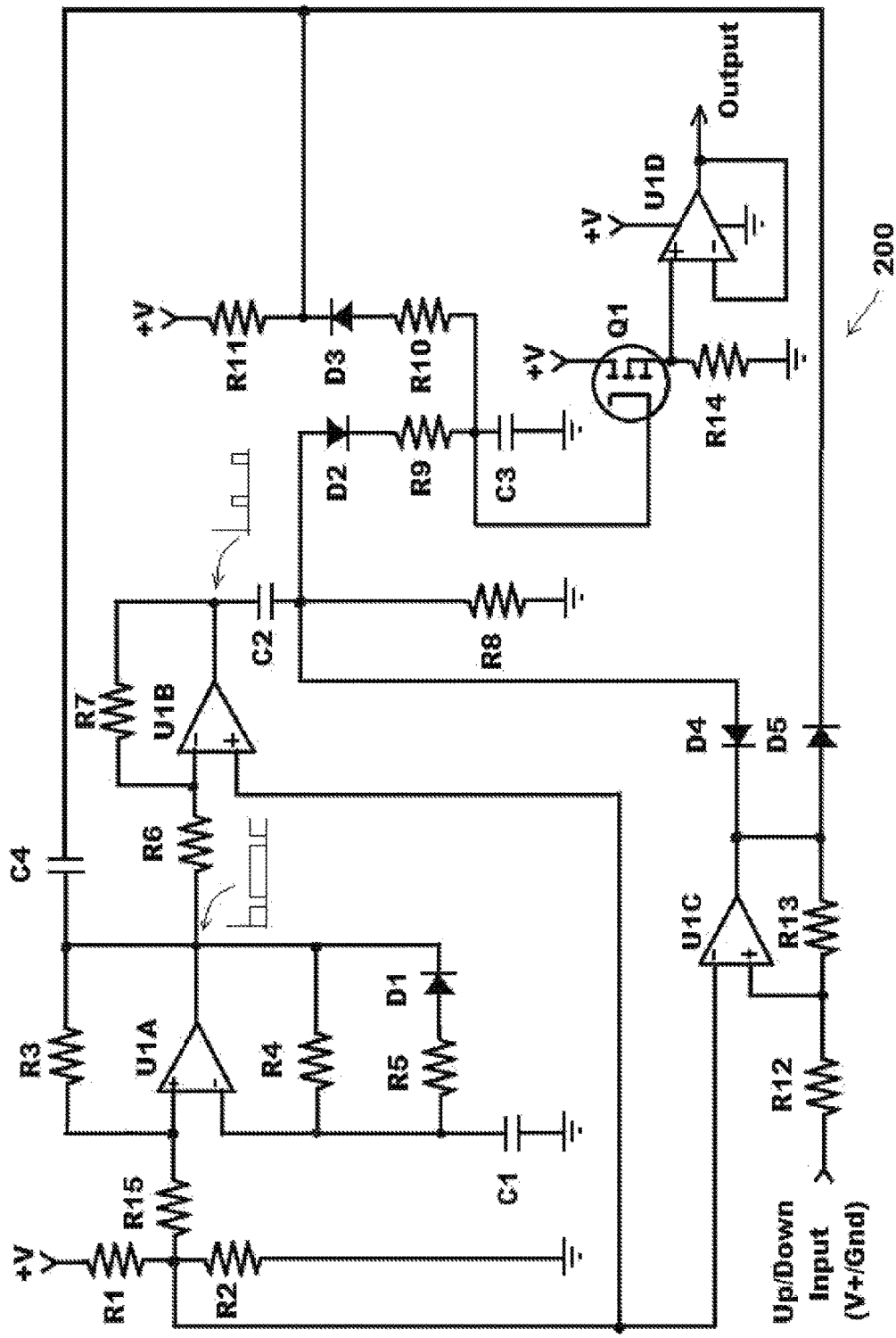
FIG. 2 is a schematic diagram showing one possible implementation of the analog timer circuit of FIG. 1.

Referring now to FIG. 2, an analog timer circuit 200 in accordance with another illustrative embodiment is shown. The analog timer circuit 200 may be viewed as a particular implementation of the analog timer circuit 100 previously described in conjunction with FIG. 1.

The analog timer circuit 200 comprises an astable multivibrator implemented using amplifier U1A, resistors R1, R2, R3, R4, R5 and R15, capacitor C1 and diode D1. The multivibrator generates an asymmetric square wave of the type shown at the output of the amplifier U1A. The asymmetric square wave is inverted by an inverter formed by amplifier U1B and resistors R6 and R7 and the resulting signal drives a capacitor charge pump implemented by capacitor C2. The analog timer circuit 200 operates from a supply voltage denoted +V.

The capacitor charge pump C2 is coupled through a charge distribution circuit to a charge storage element implemented by storage capacitor C3. The charge distribution circuit comprises resistors R8 and R9 and diode D2. Part of the positive output of capacitor charge pump C2 charges the storage capacitor C3 through D2 and R9. The charge rate is controlled by the ratio of the resistance values of resistors R8 and R9. The charge rate is also controlled by the ratio of the capacitance values of the capacitors C2 and C3, and by the frequency and asymmetry of the asymmetric square wave generated by the multivibrator.

The output of the multivibrator is also coupled to the storage capacitor C3 via a discharge pump C4 and a discharge distribution circuit comprising resistors R10 and R11 and diode D3.

The discharge rate is controlled by the ratio of the resistance values of resistors R10 and R11. The discharge rate is also controlled by the ratio of the capacitance values of the capacitors C3 and C4, and by the frequency and asymmetry of the asymmetric square wave generated by the multivibrator.

The analog timer circuit 200 further comprises an up/down driver circuit implemented using amplifier U1C, resistors R12 and R13, and diodes D4 and D5. The voltage at the upper terminal of the storage capacitor C3 will either increase or decrease based on the output state of amplifier U1C. More particularly, the U1C output state will be either high or low depending on the state of the up/down input signal applied to the non-inverting terminal of U1C via resistor R12. The inverting terminal of U1C receives a reference voltage established off the supply voltage +V by a divider comprising resistors R1 and R2. That reference voltage is also provided to the non-inverting terminal of U1B.

The up/down input signal illustratively takes on values of +V or ground potential to put the analog timer circuit 100 into respective charge or discharge modes of operation. A high output from U1C through diode D5 will prevent C4 from discharging C3 in the charge mode of operation, and a low output from U1C through diode D4 will prevent C2 from charging C3 in the discharge mode of operation.

The analog timer circuit 200 further includes an output driver. The output driver comprises a source follower circuit coupled to a unity-gain isolation amplifier U1D. The source follower circuit is implemented using a metal-oxide-semiconductor field effect transistor (MOSFET) Q1 and resistor R14. The gate of Q1 is coupled to upper terminal of storage capacitor C3. The drain of Q1 is coupled to the positive supply voltage +V. The source follower circuit presents a very high impedance to the storage capacitor C3. The unity-gain isolation amplifier U1D further provides a high impedance to the output of Q1 and a low impedance at its output. Considering the small energy pulses delivered by the charge and discharge pumps in this embodiment, the output of U1D can be considered to be substantially continuously varying with time.

As a more particular example, the analog timer circuit 200 can be configured utilizing the components and values listed below. These particular components and values should not be viewed as limiting in any way and can be varied in other embodiments.

U1A, B, C, D LM324 quad op-amp
Q1 IRFF430 MOSFET
C1 CK05BX104, 0.1 µfd, 50 VDC
C2, C4 CK05BX103, 0.01 µfd, 100 VDC
C3 C430C225K5HA, 2.2 µfd, 50 VDC
D1-D5 1N4148 low-leakage signal diode
R1, R2, R6, R12 10 KΩ
R3, R13, R15 100 KΩ
R4 2.2 MΩ
R5 270 KΩ
R7 22 KΩ
R8, R11, R14 33 KΩ
R9, R10 470 KΩ

All of the resistors listed above are assumed to be 0.1 watt rated, 5% tolerance metal film resistors.

Using the particular components and values given above, the analog timer circuit 200 provides a charge time constant of about 2340 seconds. Since R9 and C3 are 470 KΩ and 2.2 microfarads (µfd), respectively, the corresponding RC time constant for these values is about 1.03 seconds. Accordingly, this example configuration provides a time constant multiplication factor of about 2270:1.

An alternative configuration using values of 10 KΩ and 100 KΩ for R8 and R9, respectively, while keeping C3 at 2.2 µfd, provides a charge time constant of about 2160 seconds. The corresponding RC time constant for these values is about 0.22 seconds. Accordingly, this alternative configuration provides a time constant multiplication factor of 9818:1.

Further control of the charge time constant in the analog timer circuit 200 can be provided by adjusting the value of capacitor C2 relative to that of capacitor C3. More particularly, the charge time constant varies inversely with the value of the capacitor C2 for a given value of capacitor C3. Also, varying the frequency and/or asymmetry of the pulse signal generated by the multivibrator can be used to control the charge time constant.

Similar time constant adjustment mechanisms are provided for the discharge time constant using the discharge portions of the analog timer circuit 200, including resistors R10 and R11 and capacitor C4.

Those skilled in the art will recognize that a wide variety of other time constant multiplication factors can be provided in a straightforward manner for charge or discharge portions of the analog timer circuit 200, as appropriate for a given application.

It should also be noted that the charge time constant multiplication effect need not be substantially the same as the discharge time constant multiplication effect. The discharge time constant can be made different from the charge time constant by, for example, configuring the analog timer circuit 200 such that R8 is not equal to R11 and/or C2 is not equal to C4. Additionally or alternatively, different pulse signals with different frequency and/or asymmetry characteristics from different multivibrators can be used for the respective charge and discharge portions of the analog timer circuit.

It is to be appreciated that the analog timer circuit embodiments described above are presented by way of example only. Numerous alternative embodiments can be configured using additional or alternative components in other configurations. Accordingly, although illustrative embodiments of analog timer circuits have been described with reference to FIGS. 1 and 2, it is to be understood that analog timer circuits in accordance with the invention are not limited to those precise embodiments, and that various other changes and modifications may be effected by one skilled in the art without departing from the scope or spirit of the invention. For example, another illustrative embodiment of an analog timer circuit will be described below in conjunction with FIG. 6.

Examples of feedback control systems incorporating an analog timer circuit in accordance with embodiments of the invention will now be described in more detail with reference to FIGS. 3 and 4. These systems are illustratively configured for controlling temperature of a heat/cold chamber and for controlling speed of a motor, respectively. The heat/cold chamber and the motor are examples of what are more generally referred to herein as "controlled components."

Figure 3:
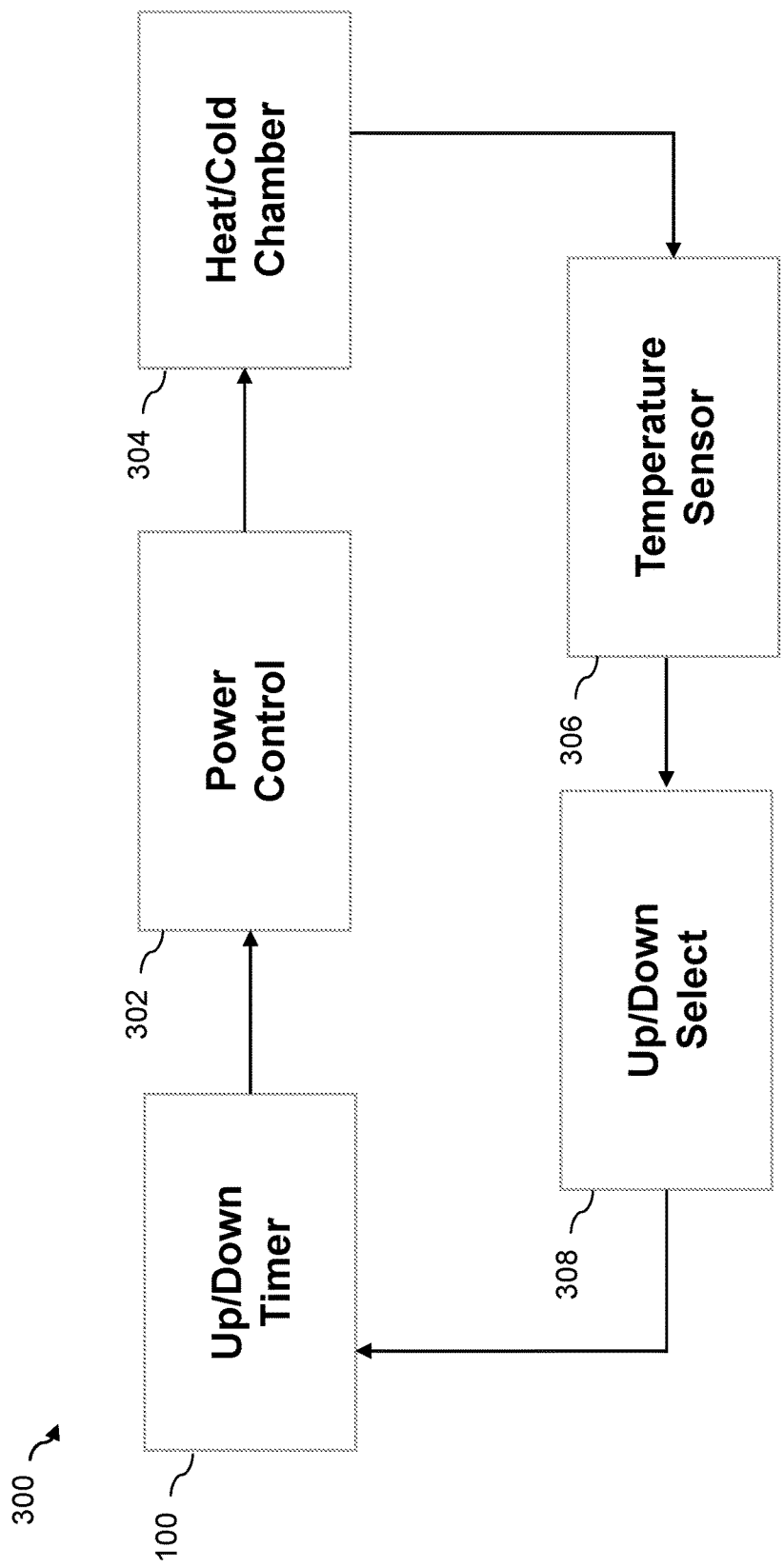
FIGS. 3 and 4 show respective illustrative embodiments of feedback control systems incorporating an analog timer circuit of the type described in conjunction with FIGS. 1 and 2.

Referring first to FIG. 3, a feedback control system 300 comprises analog timer circuit 100 and a power control circuit 302. The analog timer circuit 100 is assumed to be configured as an up/down timer, with charge and discharge modes of operation, as previously described in conjunction with FIG. 1. The power control circuit 302 has an input coupled to an output of the analog timer circuit 100.

The controlled component in this embodiment comprises a heat/cold chamber 304. The heat/cold chamber 304 has an input coupled to an output of the power control circuit 302. The heat/cold chamber 304 is illustratively configured for use in long-term temperature cycling of electronic components for reliability testing or normalization purposes, or other temperature cycling arrangements that utilize relatively long time constants.

The feedback control system 300 further comprises a temperature sensor 306 having an input coupled to an output of the heat/cold chamber 304 and an output coupled to an input of the analog timer circuit 100 via an up/down select circuit 308. The temperature sensor 306 is an example of what is more generally referred to herein as a "sensor circuit."

The up/down select circuit 308 coupled between the temperature sensor 306 and the analog timer circuit 100 is configured to control selection between charge and discharge modes of operation of the analog timer circuit 100, responsive to an output signal generated by the temperature sensor 306.

Figure 4:
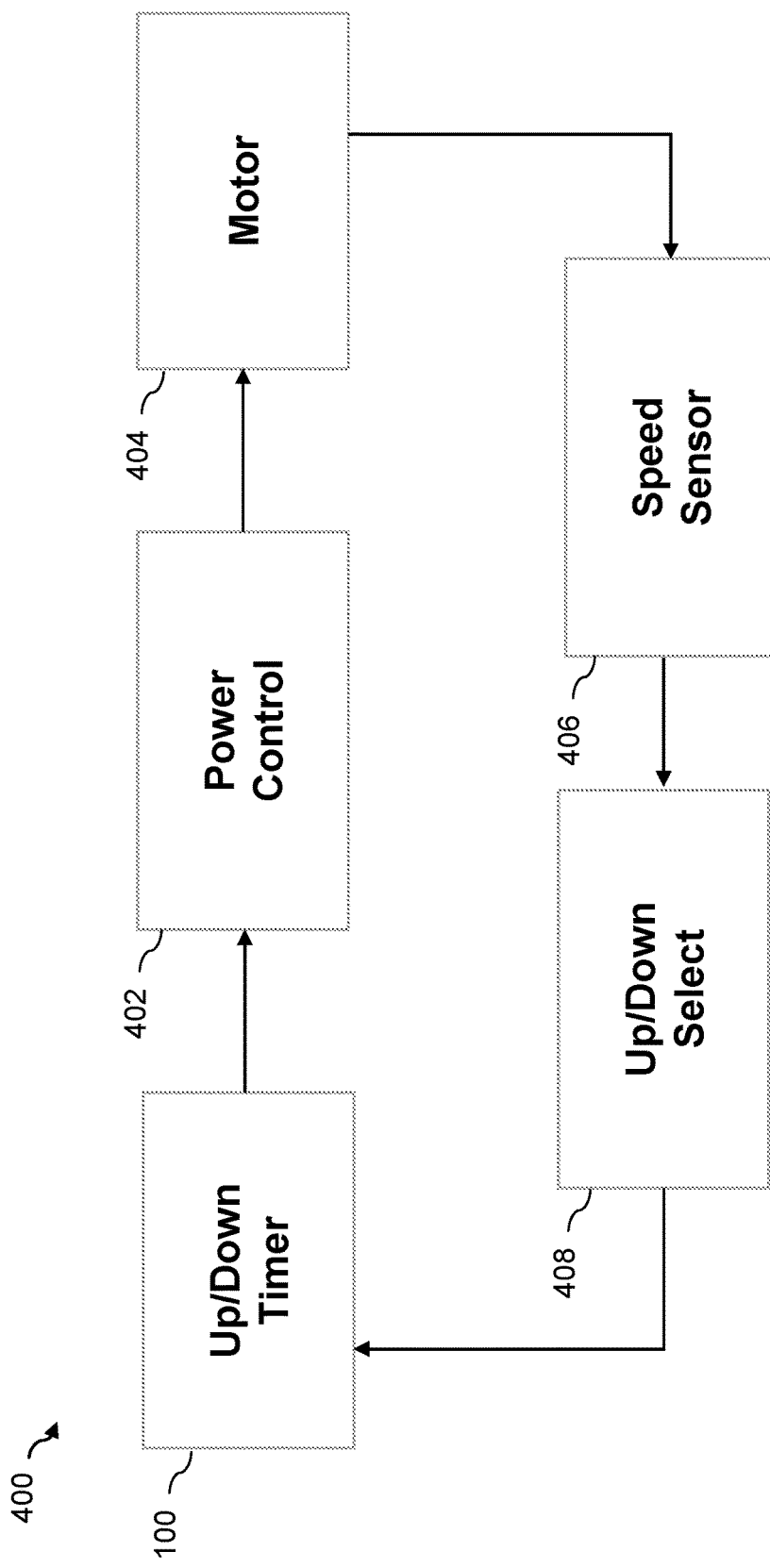

The FIG. 4 embodiment operates in a manner similar to the FIG. 3 embodiment, but the controlled component in this embodiment is a motor. Such an arrangement can be utilized, for example, for long-term testing of the motor. A feedback control system 400 comprises analog timer circuit 100 configured as an up/down timer, a power control circuit 402, a controlled component comprising a motor 404, a sensor circuit comprising a speed sensor 406, and an up/down select circuit 408. The up/down select circuit 408 is configured to control selection between charge and discharge modes of operation of the analog timer circuit 100, responsive to an output signal generated by the speed sensor 406.

It is also to be appreciated that the particular control systems illustrated in FIGS. 3 and 4 are exemplary only, and numerous other system arrangements incorporating an analog timer circuit may be used in other embodiments. For example, the disclosed techniques may be adapted in a straightforward manner for providing analog timer circuits with relatively long time constants in a wide variety of other system applications. Such applications can illustratively include any type of system in which a substantially continuous slowly increasing or decreasing analog timer output is needed.

As mentioned previously, an illustrative embodiment of hot water boiler control circuitry that utilizes an analog timer circuit will be described below in conjunction with FIGS. 5, 6 and 7. Such hot water boiler control circuitry in combination with other system components illustratively implements a feedback control system for control of a hot water boiler in a residential or commercial environment. Numerous other feedback control systems can be configured in other embodiments. For example, control circuitry embodiments of the invention are not limited to use in hot water boiler control applications.

Figure 5:
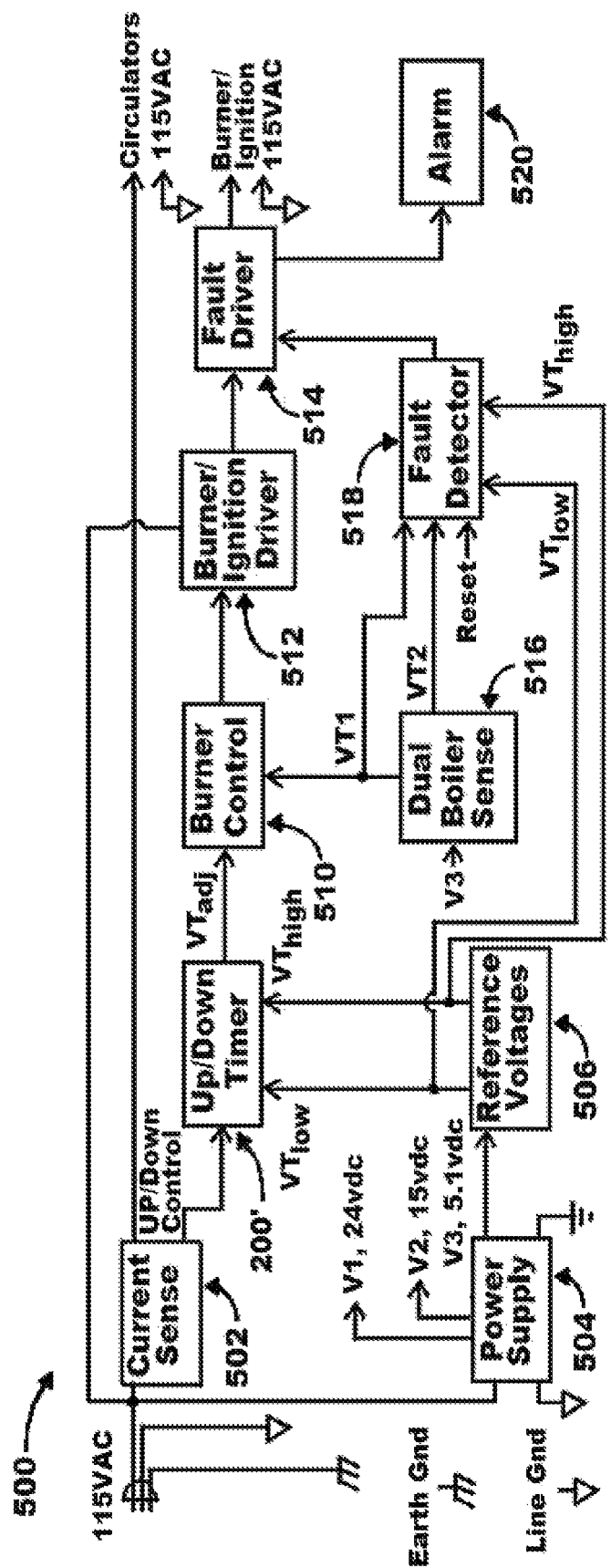
FIG. 5 is a block diagram of boiler control circuitry comprising an analog timer circuit in an illustrative embodiment.

Referring now to FIG. 5, boiler control circuitry in the form of boiler control 500 illustratively comprises current sense circuit 502, power supply 504, reference voltages circuit 506, burner control circuit 510, burner/ignition driver 512, fault driver 514, dual boiler sense circuit 516, fault detector 518 and alarm 520. The boiler control 500 further comprises an analog up/down timer circuit 200' which illustratively comprises an analog timer circuit similar to the analog timer circuit 200 previously described in conjunction with FIG. 2.

The boiler control 500 is assumed to be implemented in a heating system comprising a boiler, a burner configured to burn fuel to heat liquid in the boiler, and one or more circulation loops through which heated liquid from the boiler is circulated in order to heat a room or area, for example, in a residential or commercial building.

The heating system further comprises at least one circulator configured to controllably circulate liquid from the boiler through the one or more circulation loops and back to the boiler responsive to one or more control signals.

The liquid heated by the boiler and circulated through the system in such an arrangement is illustratively water, although other types of liquid can be used, including, for example, water combined with various types of coolants or antifreezes, as will be appreciated by those skilled in the art. Accordingly, references herein to hot water boilers, hot water boiler control circuitry and similar terminology referring to water or hot water should be construed as examples only.

The fuel that is burned to heat the liquid in the boiler may be, for example, heating oil, natural gas, propane or other types of fuels. In the case of heating oil, ignition of a burner is typically associated with activation of a fuel pump to provide the heating oil to the burner for ignition. Similarly, in the case of natural gas, ignition of a burner is typically associated with activation of a gas valve to provide the natural gas to the burner for ignition. In some embodiments, a common signal is utilized for both activation of the fuel pump and ignition of the burner in the heating oil case, or for both activation of the gas valve and ignition of the burner in the natural gas case. References herein to terms such as "ignition control signal" and "ignition signal" are therefore intended to be broadly construed and may be utilized in providing additional functionality other than ignition control or ignition, such as activation of a fuel pump or gas valve in conjunction with ignition.

The current sense circuit 502 is configured to detect activation of at least one circulator arranged to circulate liquid from a boiler through a circulation loop and back to the boiler. More particularly, in this embodiment, the current sense circuit 502 is arranged in series with an alternating-current (AC) control line of the circulator. The current sense circuit 502 is an example of what is more generally referred to herein as a "sensor circuit," and other types of sensor circuits can be utilized to detect activation of one or more circulators in other embodiments.

It is further assumed in this embodiment that the heating system comprises multiple circulators, all controlled by an AC control line, illustratively 115 volts AC. Activation of a given one of the circulators illustratively refers to configuration of the circulator to cause liquid to be circulated through a corresponding circulation path or loop. This can be viewed in some embodiments as turning the circulator "on."

The analog up/down timer circuit 200' has an input coupled to an output of the current sense circuit 502 and is configured to generate a variable threshold voltage VTadj that varies as a function of an activation time of the circulator. The variable threshold voltage is an example of what is more generally referred to herein as a "variable threshold signal." Other embodiments can utilize other types of variable threshold signals, such as current signals or power signals, in implementing a boiler control or other type of electronic control circuitry as disclosed herein, as will be readily apparent to those skilled in the art.

The burner control circuit 510 is configured to receive the variable threshold voltage VTadj from the analog up/down timer circuit 200' and to generate an ignition control signal based at least in part on comparison of a temperature sensor voltage VT1 of the boiler with the variable threshold voltage VTadj.

The burner/ignition driver 512 is configured to receive the ignition control signal from the burner control circuit 510 and to generate an ignition signal for the burner based at least in part on the ignition control signal. As mentioned previously, such an ignition signal in some embodiments is assumed to be utilized not only for burner ignition, but also to activate a fuel pump or gas valve in addition to igniting the burner in order to burn the fuel supplied thereto by the fuel pump or gas valve. This is the assumption in the present embodiment and thus the ignition signal is more specifically denoted in the figure as a burner/ignition signal to emphasize that in this embodiment the ignition signal also controls fuel pump or gas valve activation. Numerous other types and arrangements of ignition signals and associated ignition control signals can be used in other embodiments. For example, in some embodiments, separate signals can be used for activation of a fuel pump or gas valve and ignition of a burner to burn the fuel supplied by the fuel pump or gas valve.

In the present embodiment, the burner/ignition signal provided to the burner is more particularly generated by the burner/ignition driver 512 operating in conjunction with the fault driver 514. The drivers 512 and 514 may be collectively viewed as one possible implementation of an "ignition driver" as that term is broadly used herein.

The power supply 504 in this embodiment provides three distinct supply voltages, including supply voltages denoted V1, V2 and V3, illustratively 24 volts, 15 volts and 5.1 volts, all direct current (DC) voltage or vdc.

The reference voltages circuit 506 generates high and low temperature limit voltages denoted VThigh and VTlow, respectively, utilizing the supply voltage V3. These high and low limit voltages are also referred to elsewhere herein as Vhigh and Vlow, and illustratively correspond to high and low temperature limits of 180° F. and 120° F., respectively. Other high and low temperature limits can be used in other embodiments. The high and low temperature limit voltages VThigh and VTlow are applied as inputs to the analog up/down timer 200' as shown, and utilized in the generation of the variable threshold voltage VTadj.

The dual boiler sense circuit 516 also receives the supply voltage V3, and generates first and second temperature sensor voltages VT1 and VT2 from respective first and second temperature sensors that are arranged to measure the temperature of the liquid in the boiler. The temperature sensor voltages VT1 and VT2 are examples of what are more generally referred to herein as temperature sensor signals. The first temperature sensor voltage VT1 is applied to the burner control circuit 510 for comparison therein with the variable threshold voltage VTadj. The first and second temperature sensor voltages VT1 and VT2 are applied as input to the fault detector 518. The fault detector 518 also receives as inputs the high and low temperature limit voltages VThigh and VTlow.

The fault detector 518 is configured to monitor the first and second temperature sensor voltages VT1 and VT2 and to generate a fault indication signal if the first and second temperature sensor voltages VT1 and VT2 differ from one another by more than a designated amount. The fault indication signal is applied to the fault driver 514 and is also utilized to drive alarm 520, which may be configured to generate an audible or visual alarm signal or combinations of multiple alarm signals of different types. The fault detector 518 is an example of what is more generally referred to herein as a "fault detection circuit," and other types of fault detection circuits can be used in other embodiments. For example, in some embodiments, the fault detector 518 can be configured to detect conditions under which at least one of the temperature sensor voltages VT1 and VT2 falls outside of a designated range. Numerous alternative arrangements are possible, as will be apparent to those skilled in the art.

The fault detector 518 further includes a reset input configured to receive a reset signal, possibly from a pushbutton reset control switch accessible to a user. This allows the fault detector 518 to be reset or cleared after detection of a fault. Other types of reset mechanisms can be implemented in other embodiments.

Figure 6:
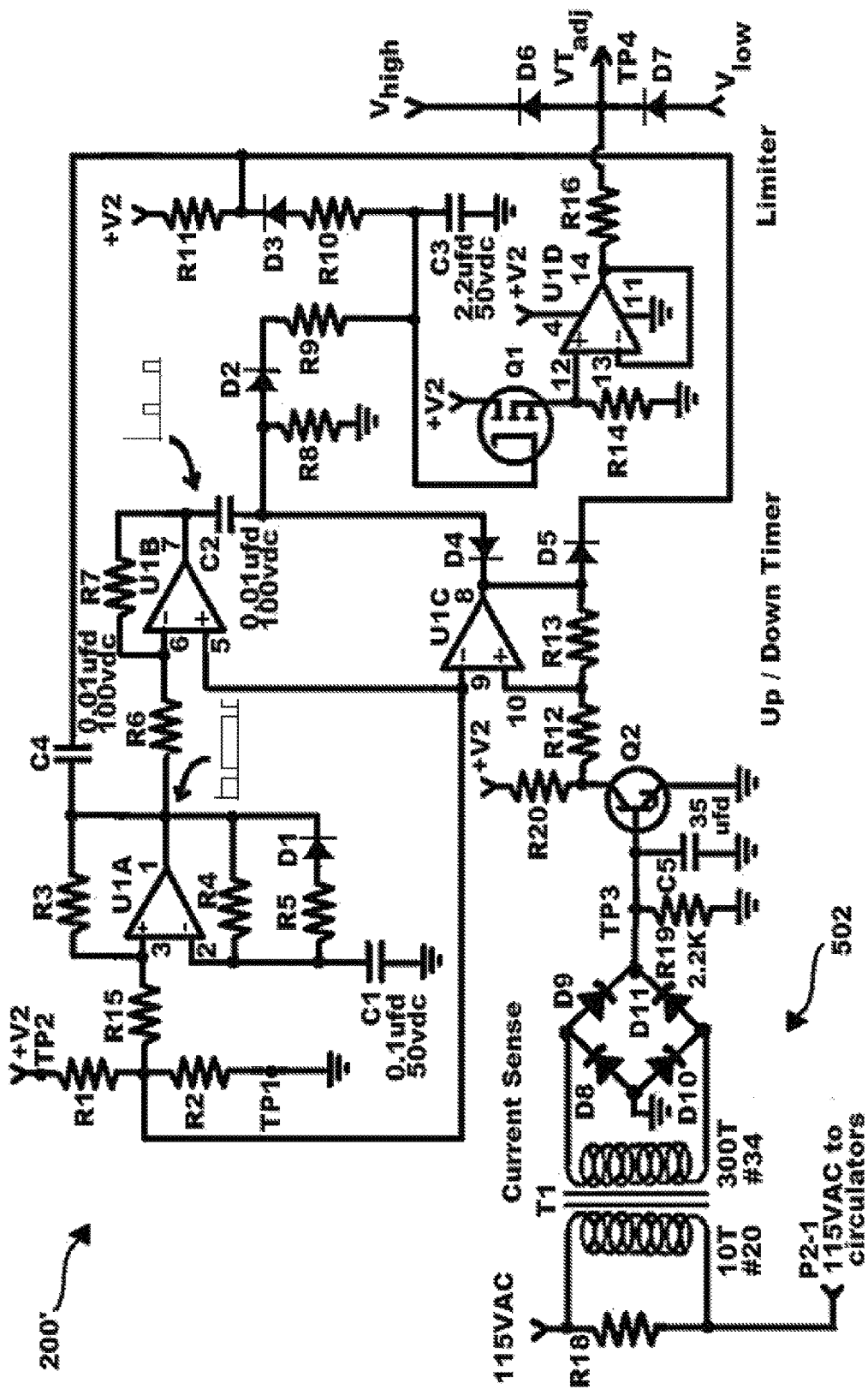
FIGS. 6 and 7 are schematic diagrams showing possible implementations of portions of the boiler control circuitry of FIG. 5.

Referring now to FIG. 6, the up/down timer circuit 200' and the current sense circuit 502 of the boiler control 500 are shown in greater detail. The up/down timer circuit 200' is substantially the same as the analog timer circuit 200 previously described in conjunction with FIG. 2, and includes op-amps U1A, U1B, U1C and U1D, transistor Q1, capacitors C1-C4, diodes D1-D5, and resistors R1-R15, all configured as previously described. The exemplary component types and values for these circuit elements as listed above in the context of FIG. 2 can also be utilized in an implementation of the FIG. 6 embodiment. Again, these particular components and values should not be viewed as limiting in any way and can be varied in other embodiments. The up/down timer circuit 200' in the FIG. 6 embodiment further comprises an output series resistor R16 and an output voltage limiter comprising diodes D6 and D7. The diodes D6 and D7 serve to limit the variable threshold voltage VTadj generated by the up/down timer circuit 200' to a range defined by the respective high and low limit voltages Vhigh and Vlow. The resistor R16 may have a value of 1 KΩ, and the diodes D6 and D7 may comprise 1N4148 low-leakage signal diodes. The up/down timer circuit 200' in this embodiment operates from the power supply voltage V2 provided by power supply 504.

The current sense circuit 502 as illustrated in FIG. 6 comprises a transformer T1, diodes D8, D9, D10 and D11, a bipolar transistor Q2, a capacitor C5, and resistors R18, R19 and R20. The diodes D8-D11 are configured to form a full-wave bridge rectifier. The transformer T1 and full-wave bridge rectifier D8-D11 are arranged to sense current in the AC control line of the circulators. A corresponding up/down control signal based on the sensed current is generated at the collector of Q2 and applied to input resistor R12 at the up/down control input of the up/down timer circuit 200'. Suitable values for C5, R18, R19 and R20 in this illustrative embodiment are 35 μfd, 0.2Ω, 2.2 KΩ and 3.3 KΩ, respectively. The transformer T1 illustratively comprises an EE 24-25 square stack core with a primary winding comprising 10 turns of #20 wire and a secondary winding comprising 300 turns of #34 wire. The diodes D8-D11 may comprise 1N4148 low-leakage signal diodes, and transistor Q1 may comprise a 2N2222 transistor. As in previous embodiments, these component types and values are examples only, and can be varied in other embodiments, as will be appreciated by those skilled in the art.

Figure 7:
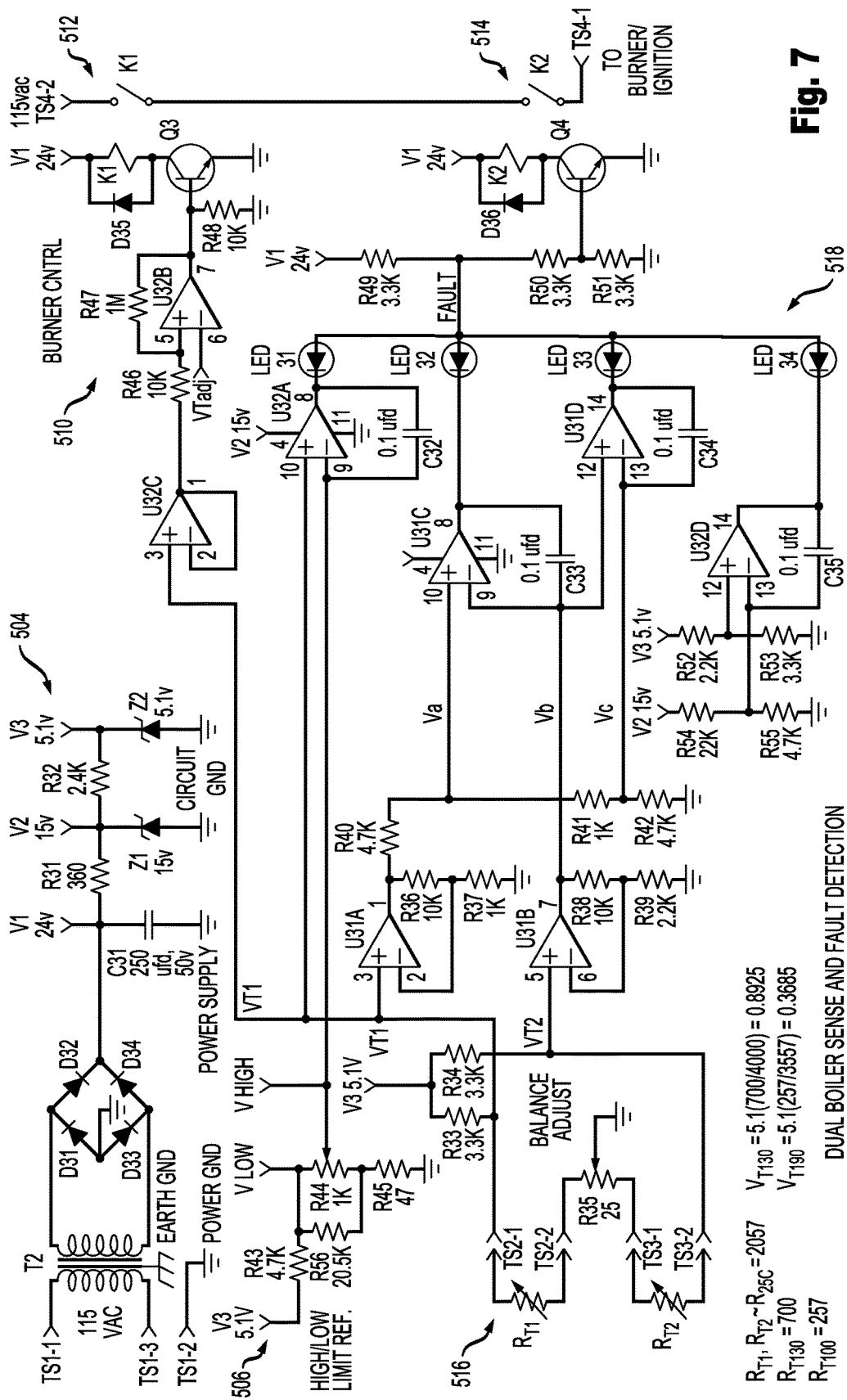

FIG. 7 shows additional portions of the boiler control 500 in greater detail. More particularly, this figure illustrates the power supply 504, the reference voltages circuit 506, the burner control circuit 510, the burner/ignition driver 512, the fault driver 514, the dual boiler sense circuit 516 and the fault detector 518.

Some of the additional portions of the boiler control 500 as illustrated in FIG. 7 include connector designations TS1-1, TS1-2, TS1-3, TS2-1, TS2-2, TS3-1, TS3-2, TS4-1 and TS4-2. These designations illustratively correspond to respective connectors, which can be altered or eliminated in other embodiments.

The power supply 504 in this embodiment comprises a transformer T2, diodes D31, D32, D33 and D34, a capacitor C31, resistors R31 and R32, and Zener diodes Z1 and Z2. The diodes D31-D34 are configured to form a full-wave bridge rectifier. The transformer T2 is coupled to AC input illustratively at 115 volts AC. The power supply voltages V1, V2 and V3 are developed across the capacitor C31, Zener diode Z1 and Zener diode Z2, respectively. The Zener diodes Z1 and Z2 illustratively have reverse breakdown voltages on the order of 15 volts and 5.1 volts, respectively. Suitable values for C31, R31 and R32 in this embodiment are 250 μfd, 360Ω and 2.4 KΩ, respectively, although other values can be used in other embodiments. The transformer T2 can be in a standard configuration. For example, a commercially-available transformer such as part number 3FS-424 from Tamura may be used.

The dual boiler sense circuit 516 comprises a pair of temperature sensors illustratively in the form of respective thermistors RT1 and RT2, as well as additional resistors R33 and R34 and an adjustable resistor R35 configured to provide a balance adjustment mechanism for the two temperature sensors. The resistance of the thermistors RT1 and RT2 decreases as the temperature of the liquid in the boiler increases. Accordingly, in this embodiment the thermistors RT1 and RT2 are implemented as respective negative temperature coefficient (NTC) thermistors, although other types of temperature sensors can be used in other embodiments.

At a relatively low temperature of about 77° F., the resistance of RT1 or RT2 is about 2057Ω, while at higher temperatures of 130° F. and 190° F. the resistance is about 700Ω and 257Ω, respectively. These latter two temperatures in some embodiments may comprise respective low and high temperature limits. The corresponding temperature sensor voltages are given by 0.8925 volts and 0.3685, respectively. Suitable values for R33 and R34 are 3.3 KΩ, and a suitable nominal value for adjustable resistor R35 is 25Ω.

The burner control circuit 510 and the fault detector 518 are illustratively implemented utilizing op-amps U31A, U31B, U31C, U31D, U32A, U32B, U32C and U32D. The op-amps may collectively comprise a pair of LM324 quad op-amps. The op-amps U31A, U31B, U31C, U31D, U32A and U32D are part of the fault detector 518, and the op-amps U32B and U32C are part of the burner control circuit 510.

The temperature sensor voltages VT1 and VT2 from the dual boiler sense circuit 516 are applied to non-inverting inputs of the op-amps U31A and U31B of the fault detector 518. The op-amps provide voltages Va, Vb and Vc to inputs of op-amps U31C, U31D and U32D for use in fault detection. The fault detector further comprises resistors R36 and R37 associated with op-amp U31A, and resistors R38 and R39 associated with op-amp U31B. Suitable values for resistors R36, R37, R38 and R39 are 10 KΩ, 1 KΩ, 10 KΩ and 2.2 KΩ, respectively. Additional resistors utilized to develop the voltages Va and Vc include R40, R41 and R42, which may be 4.7 KΩ, 1 KΩ and 4.7 KΩ, respectively. Inputs to respective non-inverting and inverting inputs of op-amp U32D are provided from respective voltage dividers coupled to respective supply voltages V2 and V3. The voltage dividers comprise respective resistor pairs R54-R55 and R52-R53. Suitable values for R54 and R55 are 22 KΩ and 4.7 KΩ, respectively. Suitable values for R52 and R53 are 2.2 KΩ and 3.3 KΩ, respectively.

The op-amps U31C, U31D, U32A and U32D of the fault detector 518 have respective feedback capacitors C32, C33, C34 and C35 arranged between their respective outputs and their respective inverting inputs. Each of these capacitors illustratively has a value of 0.1 μfd. The outputs of the op-amps U31C, U31D, U32A and U32D drive respective light-emitting diodes (LEDs) denoted LED 31, LED 32, LED 33 and LED 34, which illustratively provide visual indications of respective detected faults.

The reference voltages circuit 506 receives the supply voltage V3 from the power supply 504 and utilizes resistors R43, R44, R45 and R56 to generate the high and low temperature limit voltages Vhigh and Vlow. Resistors R43, R45 and R56 are illustratively 4.7 KΩ, 47Ω and 20.5 KΩ, respectively. Resistor R44 is illustratively an adjustable resistor having a nominal value of 1 KΩ, and provides a mechanism for adjusting Vhigh.

In this embodiment, the fault detector 518 operates on both Vhigh and Vlow in that Vhigh is developed from Vlow in the reference voltages circuit 506. Other arrangements can be used to provide Vhigh and Vlow as inputs to the fault detector 518.

The burner control circuit 510 receives the temperature sensor voltage VT1 from the dual boiler sense circuit 516 at the non-inverting input of op-amp U32C. The output of op-amp U32C is coupled to its inverting input in a unity-gain configuration, and is also coupled via resistor R46 to the non-inverting input of op-amp U32B. The inverting input of the op-amp U32B receives the variable threshold voltage VTadj from the analog up/down timer circuit 200'. Op-amp U32B is configured with a feedback resistor R47 between its output and its non-inverting input, and with resistor R48 between its output and ground. Suitable values for R46, R47 and R48 are 10 KΩ, 1 MΩ and 10 KΩ, respectively.

The burner/ignition driver 512 in this embodiment comprises an npn bipolar transistor Q3 having its base coupled to the output of the op-amp U32B. The collector of Q3 is coupled via a coil of a relay switch circuit K1 to the supply voltage V1. Protective diode D35 is arranged in parallel with the coil of the relay switch circuit K1. The relay switch circuit K1 further comprises a switch arranged in series with an AC control line of the burner, with the current through the coil controlling the state of the switch, based on the output of op-amp U32B and the corresponding on or off state of transistor Q3.

The fault driver 514 is configured in a manner similar to the burner/ignition driver 512. More particularly, the fault driver 514 comprises an npn bipolar transistor Q4 having its base coupled to the output of the fault detector 518 via a resistor network comprising R49, R50 and R51, each illustratively 3.3 KΩ. The collector of Q4 is coupled via a coil of a relay switch circuit K2 to the supply voltage V1. Protective diode D36 is arranged in parallel with the coil of the relay switch circuit K2. The relay switch circuit K2 further comprises a switch arranged in series with the AC control line of the burner, with the current through the coil controlling the state of the switch, based on the output of the fault detector 518 and the corresponding on or off state of transistor Q4.

The first and second relay switch circuits K1 and K2 are arranged such that the burner will be ignited only if the current temperature sensor voltage VT1 exceeds the variable threshold voltage VTadj and there are no detected faults. A fault is detected if any of the temperature sensor voltages goes outside of its predetermined range. Such a detected fault will advantageously prevent the burner from igniting, thereby preventing boiler temperature runaway conditions and potential catastrophic failure.

Another advantage of the above-described embodiment of boiler control 500 is that the circulators are controlled separately from the burner ignition. This is in contrast to conventional arrangements such as an Aquastat that controls both the circulators and the burner ignition. In such a conventional arrangement, a failure of the Aquastat could prevent both circulator activation and burner ignition. With the boiler control 500, the circulators could continue to run even in the presence of a fault that prevents burner ignition. Such an arrangement could be particularly advantageous in the event of a fault arising in freezing weather, as the water could continue to circulate through the system and therefore be less likely to freeze, since moving water freezes at a lower temperature than stagnant water.

The variable threshold voltage VTadj is increased or decreased by the up/down timer circuit 200' based on activation time of the circulators, as detected by the current sense circuit 502. As mentioned previously, it may be assumed in some embodiments that a heating system comprising the boiler control 500 includes a plurality of circulators. In such an arrangement, if any one of the plurality of circulators is activated by application of a control signal to its control line, the current sense circuit 502 causes the up/down timer circuit 200' to gradually decrease the adjustable threshold voltage VTadj. Thus, if only a single one of the multiple circulators is activated, or if two or more of the multiple circulators are each activated, the adjustable threshold voltage VTadj will be gradually decreased by the up/down timer circuit 200'. If all of the multiple circulators are deactivated, the current sense circuit 502 causes the up/down timer circuit 200' to gradually increase the adjustable threshold voltage VTadj.

Accordingly, in this embodiment, the boiler temperature will track outdoor temperatures based on on-off running times of the circulators. During typical winter months when the circulators are frequently activated, the adjustable threshold voltage VTadj will be automatically decreased, while during typical spring, summer or fall months of lower demand for heat, the adjustable threshold voltage VTadj will be automatically increased responsive to the reduced activation times of the circulators. The lowered boiler temperature when room or area thermostats are not calling for heat will advantageously reduce energy losses due to chimney convection, reduce fuel costs and effect a reduction in greenhouse emissions. In addition, boiler system efficiency is increased and furnace wear due to "short cycling" is eliminated.

It should be noted that the particular circuit elements and other boiler control components illustrated in FIGS. 5, 6 and 7 can be varied in other embodiments. For example, in other embodiments, the analog up/down timer can be replaced with another type of timer circuit, possibly including a digital timer. However, the use of an analog up/down timer provides significant advantages in terms of reduced cost and complexity.

Additional illustrative embodiments will now be described with reference to FIGS. 8 through 14. Each of these embodiments utilizes an auxiliary heater to couple heat to a boiler temperature sensor responsive to activation of the circulators, activation of the burner, or combinations of both activation of the circulators and activation of the burner. The auxiliary heater is also referred to as an auxiliary sensor heater. In these embodiments, the use of the auxiliary heater is based on circulator or burner activation, which as previously described herein tends to track the outside temperature, in that activation times tend to be longer for relatively cold outside temperatures than for relatively warm outside temperatures. More particularly, the on time versus the off time of the circulators and the burner tends to increase as outside temperatures decrease.

Figure 8:
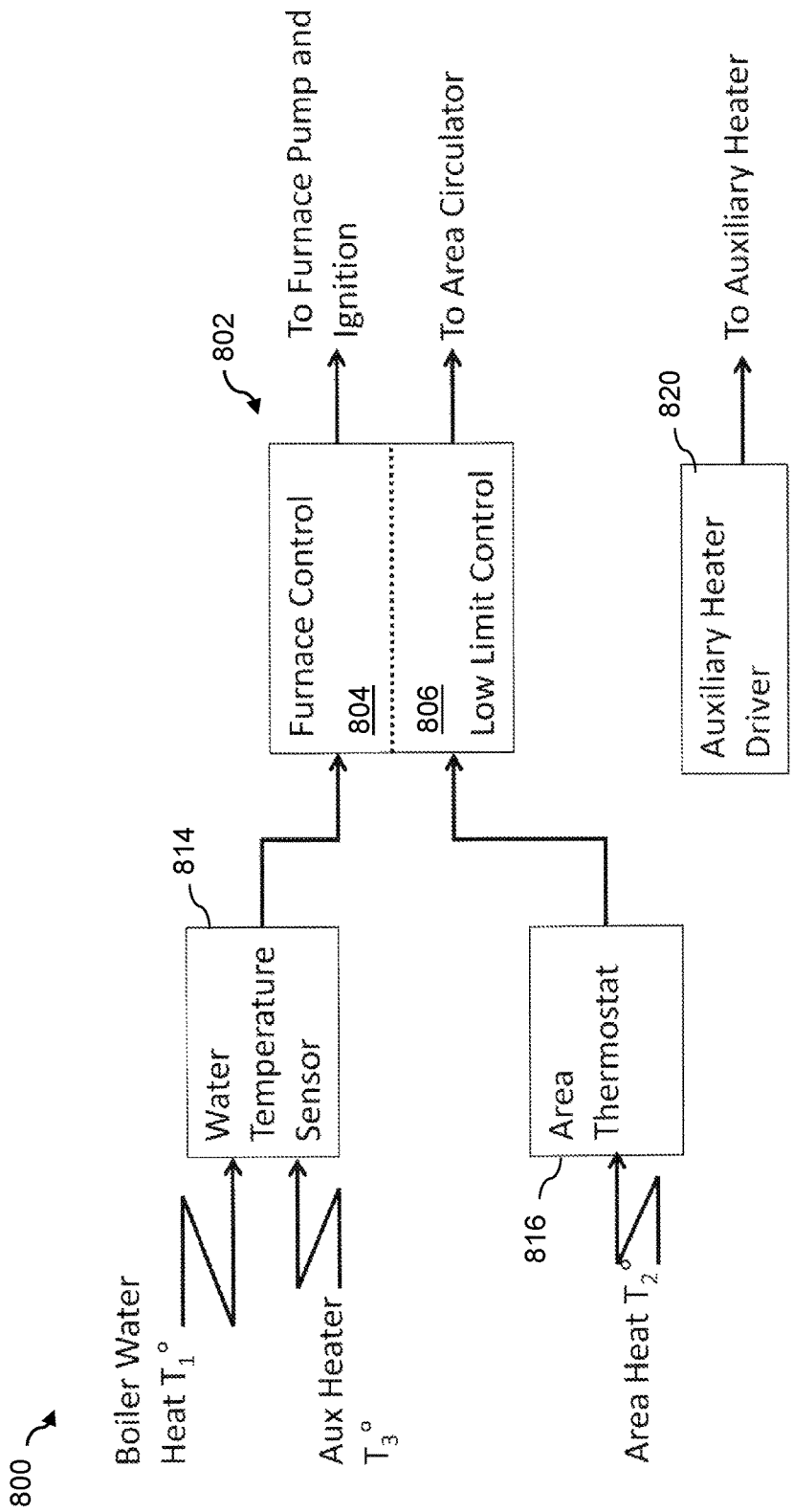
FIG. 8 is a block diagram of boiler control circuitry comprising an auxiliary heater in an illustrative embodiment.

FIG. 8 shows a boiler control 800 that includes control circuitry 802 comprising a furnace control circuit 804 and a low limit control circuit 806. The term "furnace" in these embodiments is intended to represent an example of a type of "boiler" as that term is more generally used herein. The circuits 804 and 806 may comprise portions of a conventional Aquastat, although use of an Aquastat is not a requirement of any of these embodiments.

The furnace control circuit 804 controls activation of the furnace pump and ignition of the burner responsive to a temperature sensor signal from a water temperature sensor 814. The low limit control circuit 806 controls activation of an area circulator responsive to a control signal from an area thermostat 816. The low limit control 806 ensures that the circulator is not activated until the boiler water is heated to the low limit temperature setting.

The water temperature sensor 814 receives boiler water heat denoted T1. The area thermostat 816 receives area heat T2 from the area in which it is installed. In this embodiment, the auxiliary heater is controlled by an auxiliary heater driver 820, which generates additional heat T3 which is sensed by the water temperature sensor 814. The auxiliary heater illustratively comprises an electrical heater that is coupled to the water temperature sensor 814. More particularly, the electrical heater comprising the auxiliary heater may be implemented as a fixed resistance power resistor.

In other embodiments, other types of auxiliary heaters may be used, including by way of example auxiliary heaters based on positive temperature coefficient (PTC) resistors. The use of PTC resistors can enhance performance in some embodiments by allowing application over widely varying incoming voltage supplies. More particularly, the resistance of a PTC resistor can self-adjust for a given change in the applied line voltage level in order to provide the proper auxiliary heat level.

The auxiliary heater is turned on by the auxiliary heater driver 820 responsive to deactivation of the circulators, deactivation of the burner, or deactivation of both. This will reduce the boiler temperature as the outside temperature increases. The lowered boiler temperature will reduce energy losses due to chimney convection, reduce fuel costs and finally effect a reduction in greenhouse emissions.

Figure 9:
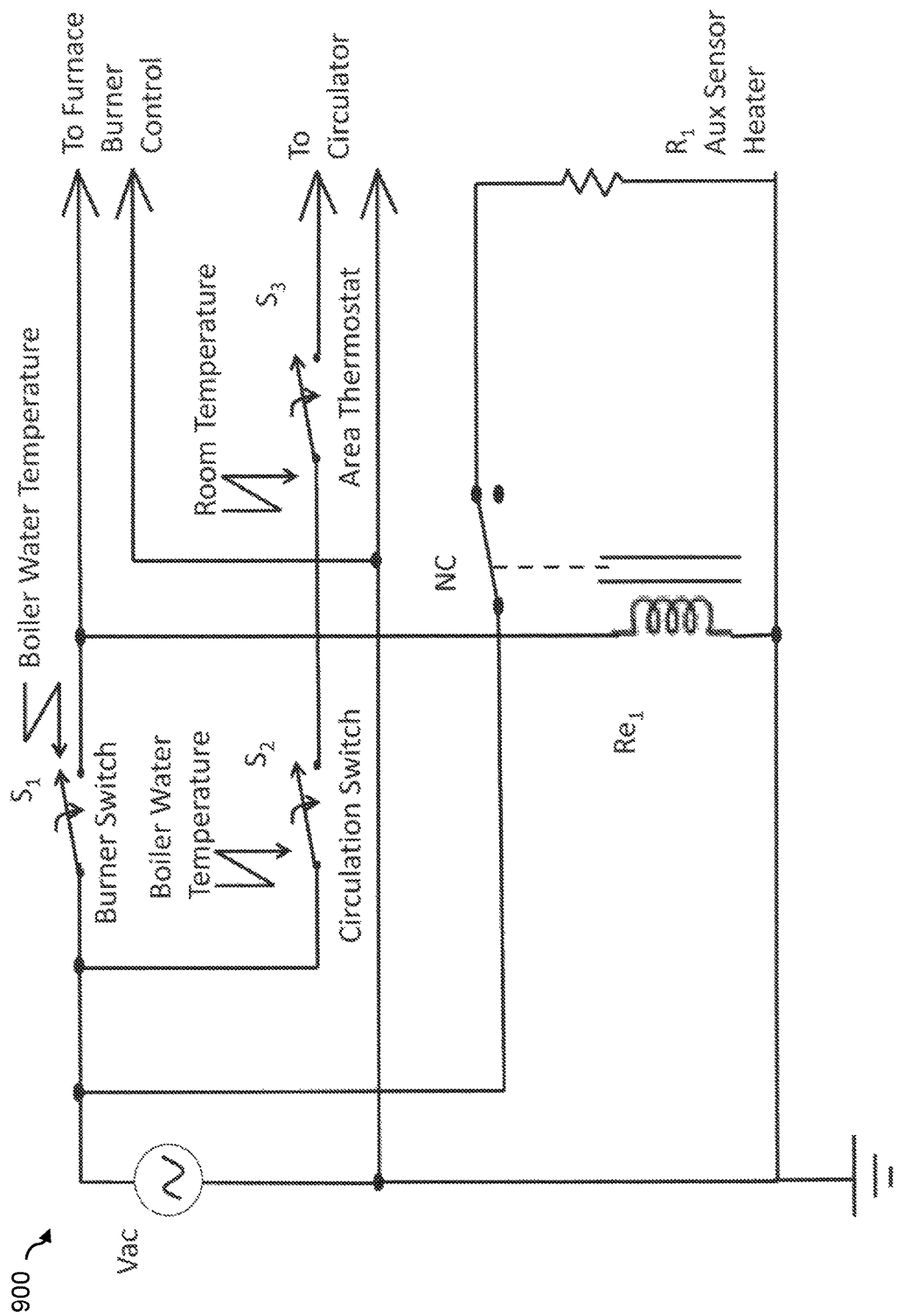
FIGS. 9, 10 and 11 are schematic diagrams of respective relay-based implementations of portions of the boiler control circuitry of FIG. 8.
Figure 10:
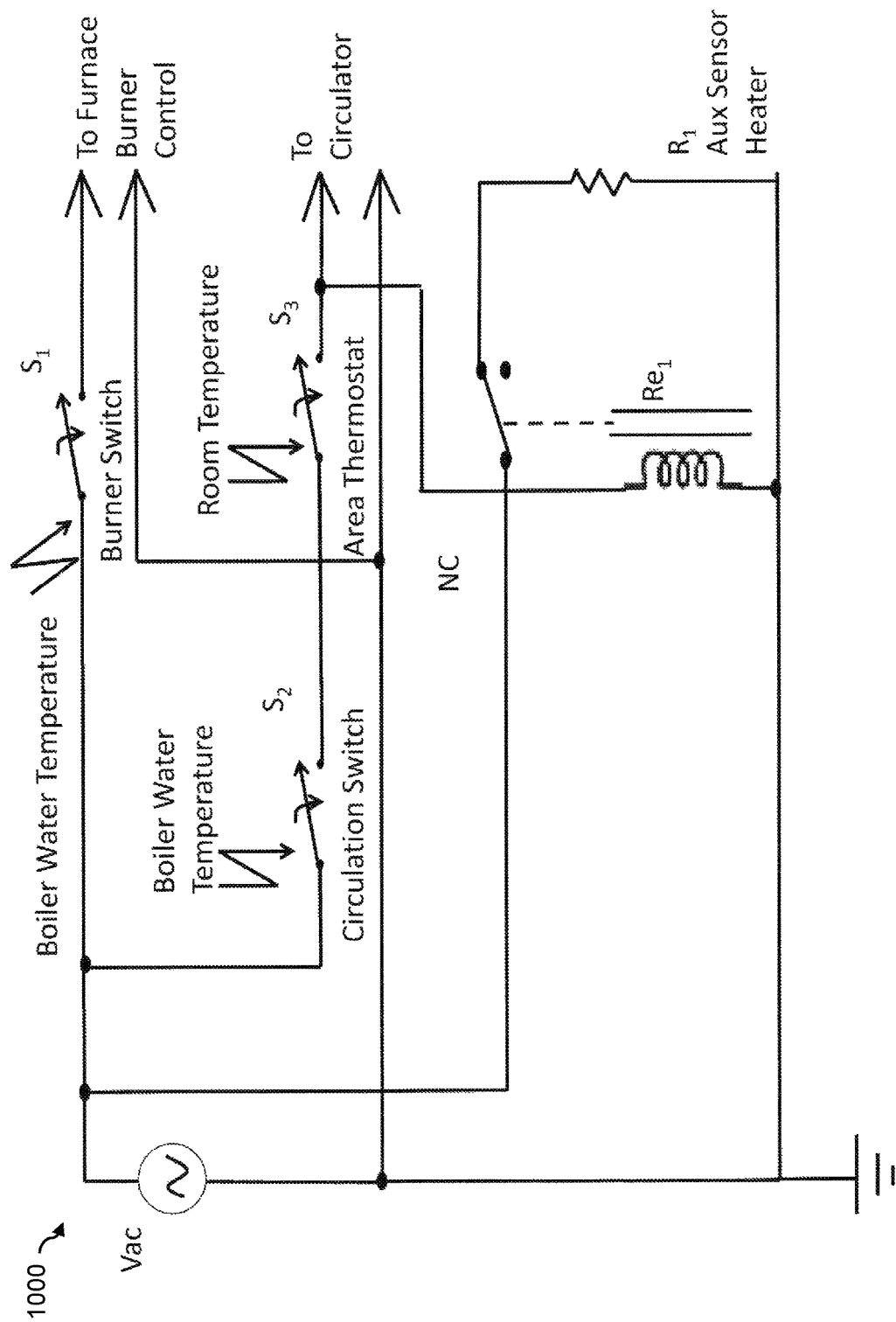
Figure 11:
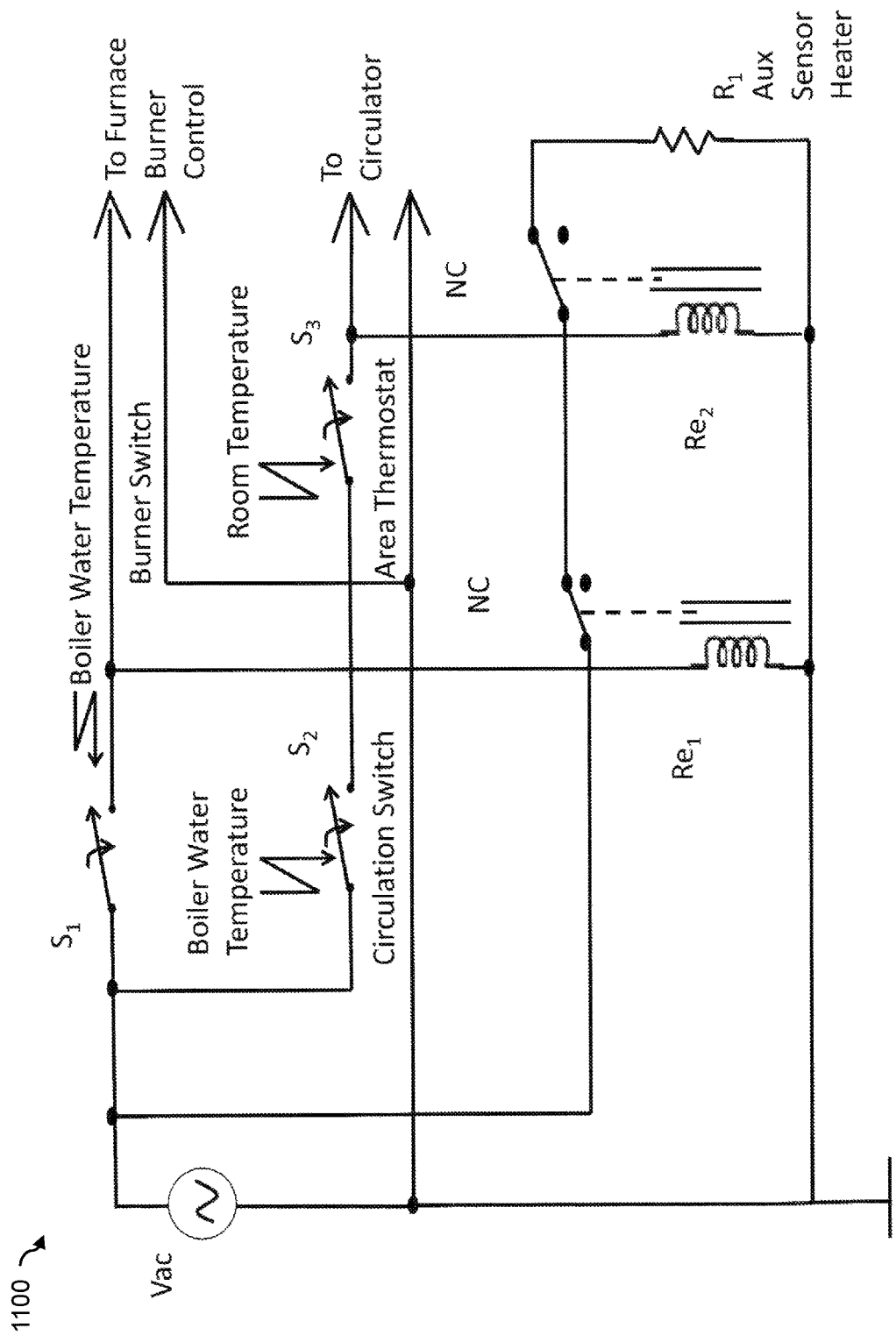

FIGS. 9, 10 and 11 are schematic diagrams of respective relay-based implementations of portions of the boiler control circuitry of FIG. 8.

Referring initially to FIG. 9, boiler control 900 comprises a burner switch S1, a circulation switch S2 and an area thermostat switch S3. These switches control activation of the burner and the circulators by controlling application of an AC control signal Vac to the burner via switch S1 and to the circulator via switches S2 and S3. More particularly, the burner switch S1 controls activation of the burner responsive to the boiler water temperature, and the circulation switch S2 and area thermostat switch S3 collectively control activation of the area circulator responsive to the boiler water temperature and the room or area temperature, respectively. The boiler control 900 further comprises a relay Re1 that is operative to activate an auxiliary sensor heater R1 when the burner switch S1 is in its open position. When the burner switch S1 is closed, the auxiliary sensor heater R1 is deactivated by the relay Re1. This arrangement effectively reduces the trip temperature of the burner switch S1 as the outside temperature increases.

The boiler control 1000 of FIG. 10 is similar to boiler control 900 but the relay Re1 is operative to activate the auxiliary sensor heater R1 when at least one of the switches S2 and S3 is open. When both switches S2 and S3 are closed, the auxiliary sensor heater R1 is deactivated by the relay Re1.

The boiler control 1100 of FIG. 11 represents a combination of the FIG. 9 and FIG. 10 embodiments. A first relay Re1 operates as in the boiler control 900 and a second relay Re2 operates as in the boiler control 1000. Accordingly, in this embodiment, the auxiliary sensor heater R1 is activated when switch S1 is open and when at least one of the switches S2 and S3 is open. As a result, the auxiliary heat is coupled to the boiler water temperature sensor only when neither the burner nor the circulator is activated. The auxiliary sensor heater R1 is deactivated when S1 is closed or when both switches S2 and S3 are closed.

The electromechanical relays shown in FIGS. 9, 10 and 11 can be replaced by solid state circuitry. Examples of solid state circuit relay replacements for FIGS. 9, 10 and 11 are shown in FIGS. 12, 13 and 14, respectively.

Figure 12:
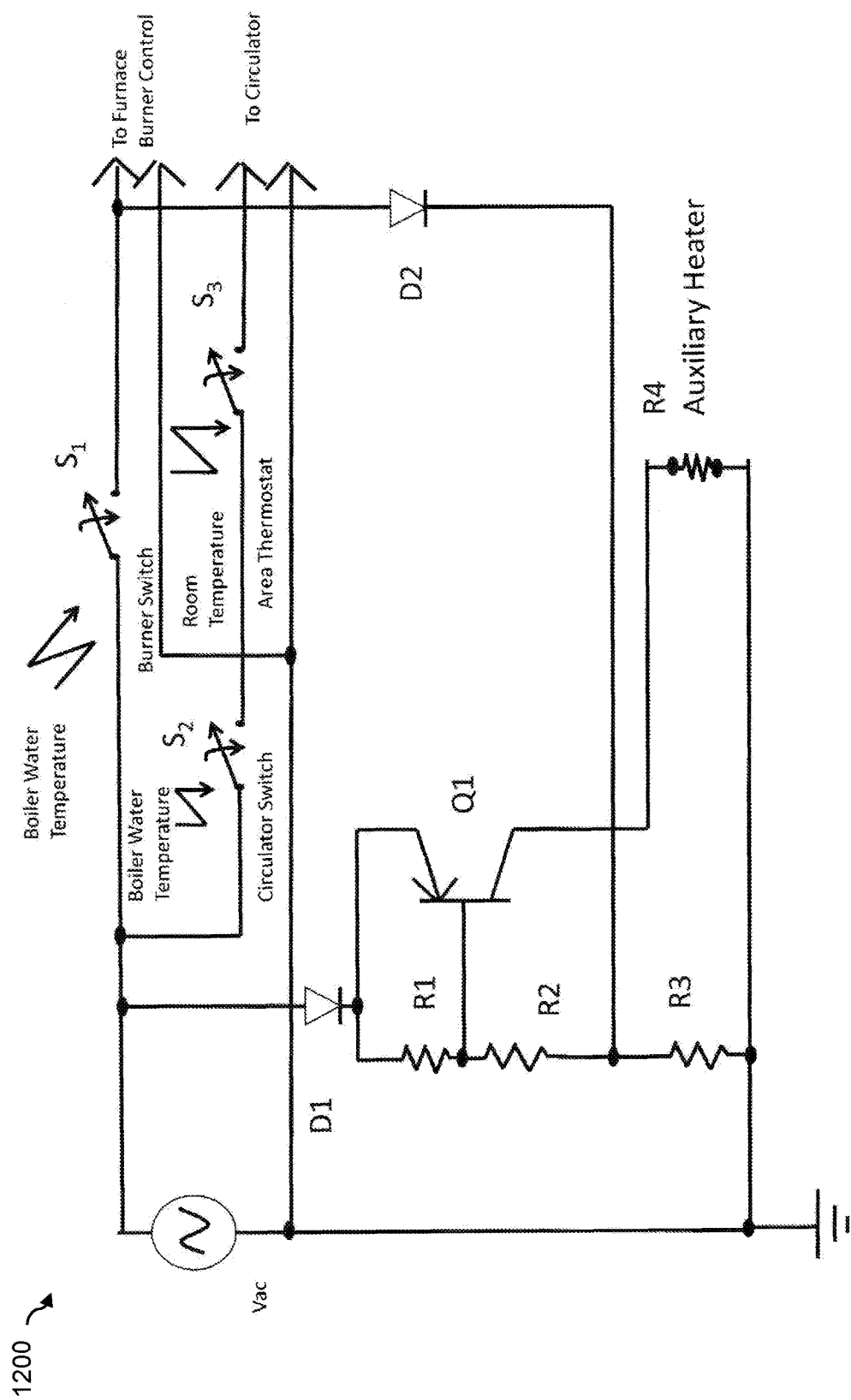
FIGS. 12, 13 and 14 are schematic diagrams of respective solid state based implementations of portions of the boiler control circuitry of FIG. 8.

The boiler control 1200 of FIG. 12 represents a solid state implementation of the boiler control 900 of FIG. 9. In this embodiment, the AC signal Vac is rectified by D1 and the resulting DC voltage is coupled to a resistor divider network comprising resistors R1, R2 and R3. The selected values of these resistors bias a power transistor Q1 to its on state. This in turn energizes an auxiliary heater comprising a power resistor R4 and provides the auxiliary heat to the boiler water temperature sensor. When AC power is connected to the burner via the burner switch S1, it is rectified by diode D2 and the resulting DC voltage is connected to the junction of R1 and R2. This back biases transistor Q1 into its off state.

Figure 13:
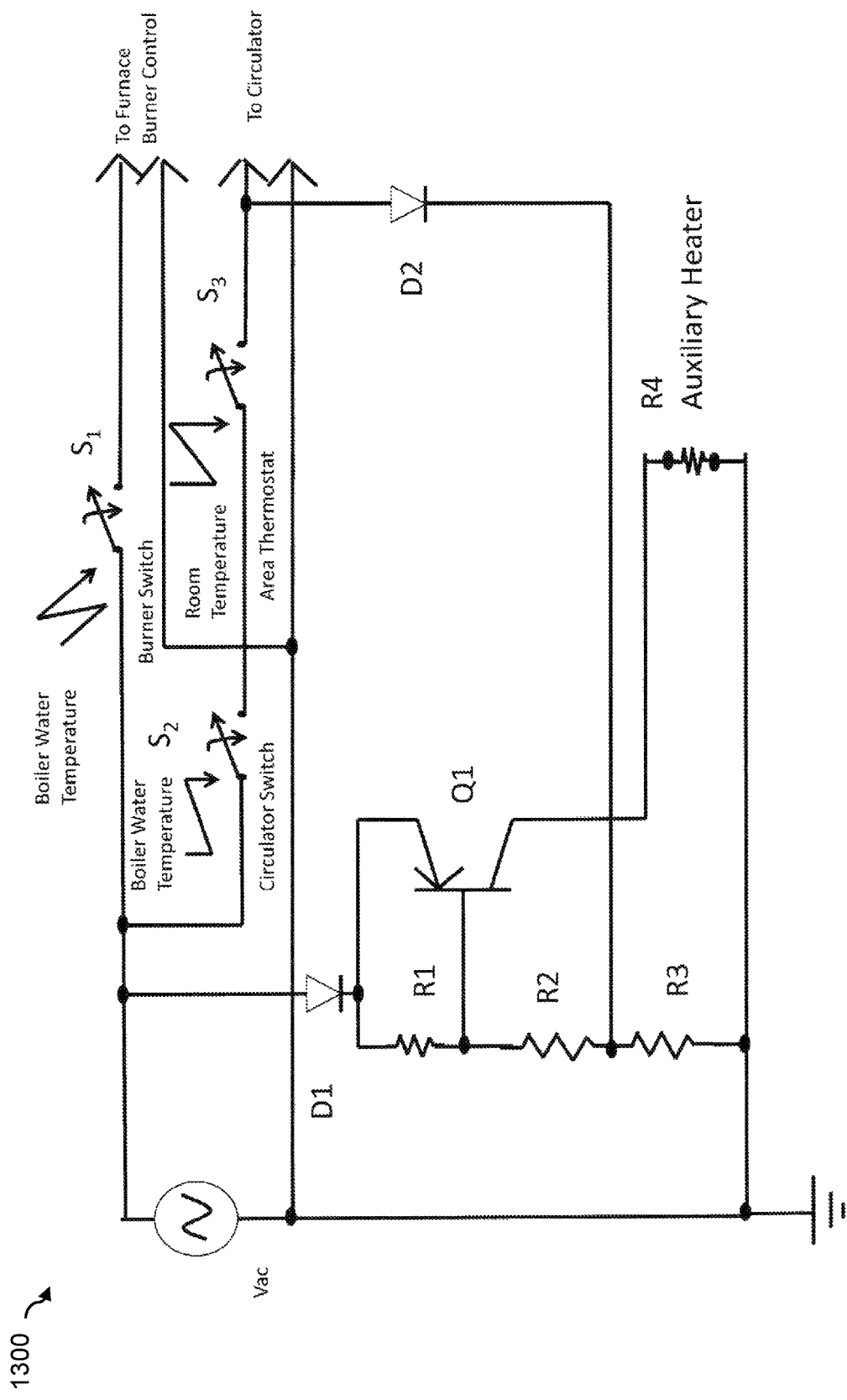

The boiler control 1300 of FIG. 13 represents a solid state implementation of the boiler control 1000 of FIG. 10. In this embodiment, Q1 is back biased to its off state when the circulator is activated via switches S2 and S3.

Figure 14:
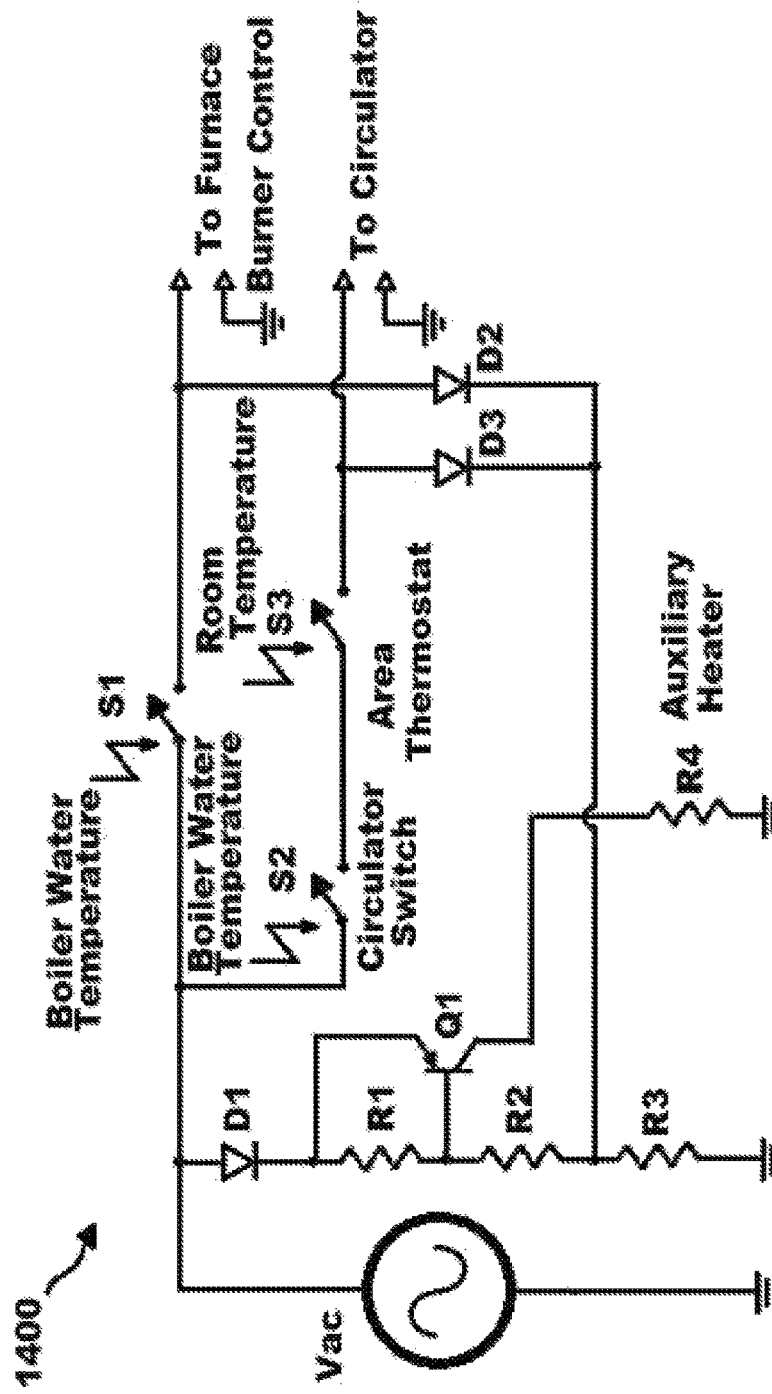

The boiler control 1400 of FIG. 14 represents a solid state implementation of the boiler control 1100 of FIG. 11. In this embodiment, Q1 is back biased to its off state when either the burner is activated via switch S1 or the circulator is activated via switches S2 and S3. This embodiment utilizes three diodes D1, D2 and D3 arranged as shown, and Q1 will be biased off by voltage fed back by either diode D2 or D3.

The illustrative embodiments of FIGS. 12-14 can be configured to automatically adjust the effective resistance of the auxiliary heater for a change in the applied line voltage level in order to provide the proper auxiliary heat level.

It should again be emphasized that the above-described embodiments of the invention are presented for purposes of illustration only. Many variations and other alternative embodiments may be used. For example, the disclosed techniques are applicable to a wide variety of other types of circuits and systems. Also, the particular configurations of circuit and system elements shown in FIGS. 1 through 14 can be varied in other embodiments. Thus, for example, the particular types and arrangements of control circuitry elements and other components deployed in a given embodiment and their respective configurations may be varied. Moreover, the various assumptions made above in the course of describing the illustrative embodiments should also be viewed as exemplary rather than as requirements or limitations of the invention. Numerous other alternative embodiments within the scope of the appended claims will be readily apparent to those skilled in the art.

What is claimed is:

1. An apparatus comprising:
   a sensor circuit configured to detect activation of at least one circulator arranged to circulate liquid from a boiler through at least one circulation loop and back to the boiler;
   an analog up/down timer circuit having an input coupled to an output of the sensor circuit and configured to generate a variable threshold signal that varies as a function of an activation time of said at least one circulator;

a burner control circuit configured to receive the variable threshold signal from the analog up/down timer circuit and to generate an ignition control signal based at least in part on comparison of a temperature sensor signal of the boiler with the variable threshold signal; and an ignition driver configured to receive the ignition control signal from the burner control circuit and to generate an ignition signal for a burner configured to burn fuel to heat the liquid in the boiler based at least in part on the ignition control signal;

wherein said at least one circulator comprises a plurality of circulators; and wherein the analog up/down timer circuit is configured to generate the variable threshold signal at least in part by being configured:

to charge a charge storage element in a charge mode of operation for a period of time for which at least one of the plurality of circulators is activated; and to discharge the charge storage element in a discharge mode of operation for a period of time for which none of the plurality of circulators is activated.

2. The apparatus of claim 1 wherein the analog up/down timer circuit comprises:
a pulse source;
the charge storage element;
a charge pump coupled between the pulse source and the charge storage element; and
a discharge pump coupled between the pulse source and the charge storage element;
wherein a pulse signal generated by the pulse source is utilized to charge the charge storage element via the charge pump in a charge mode of operation for a period of time for which at least one of the plurality of circulators is activated and to discharge the charge storage element via the discharge pump in a discharge mode of operation for a period of time for which none of the plurality of circulators is activated.

3. The apparatus of claim 2 wherein the analog up/down timer circuit is configured in a particular one of the charge and discharge modes of operation responsive to an up/down control signal generated by the sensor circuit.

4. The apparatus of claim 2 wherein the charge pump and the discharge pump are driven by respective ones of complemented and uncomplemented versions of the pulse signal generated by the pulse source.

5. The apparatus of claim 2 wherein the analog up/down timer circuit further comprises:
a charge distribution circuit coupled between the charge pump and the charge storage element;
wherein the charge distribution circuit comprises first and second circuit paths separating energy from the charge pump into respective first and second portions;
the first circuit path providing the first portion of the charge pump energy to the charge storage element; and
the second circuit path diverting the second portion of the charge pump energy away from the charge storage element.

6. The apparatus of claim 2 wherein the analog up/down timer circuit further comprises:
a discharge distribution circuit coupled between the discharge pump and the charge storage element;
wherein the discharge distribution circuit comprises first and second circuit paths separating energy from the discharge pump into respective first and second portions;
the first circuit path providing the first portion of the discharge pump energy to the charge storage element; and
the second circuit path diverting the second portion of the discharge pump energy away from the charge storage element.

7. The apparatus of claim 1 further comprising a dual boiler sense circuit, the dual boiler sense circuit comprising:
a first temperature sensor configured to generate the temperature sensor signal as a first temperature sensor voltage; and
a second temperature sensor configured to generate a second temperature sensor voltage.

8. The apparatus of claim 7 further comprising a fault detection circuit configured to monitor the first and second temperature sensor voltages and to generate a fault indication signal if the first and second temperature sensor voltages differ from one another by more than a designated amount.

9. An apparatus comprising:
a sensor circuit configured to detect activation of at least one circulator arranged to circulate liquid from a boiler through at least one circulation loop and back to the boiler;
an analog up/down timer circuit having an input coupled to an output of the sensor circuit and configured to generate a variable threshold signal that varies as a function of an activation time of said at least one circulator;
a burner control circuit configured to receive the variable threshold signal from the analog up/down timer circuit and to generate an ignition control signal based at least in part on comparison of a temperature sensor signal of the boiler with the variable threshold signal; and
an ignition driver configured to receive the ignition control signal from the burner control circuit and to generate an ignition signal for a burner configured to burn fuel to heat the liquid in the boiler based at least in part on the ignition control signal;
wherein said at least one circulator comprises a plurality of circulators and the sensor circuit comprises a current sense circuit arranged in series with respective alternating-current control lines of the plurality of circulators.

10. An apparatus comprising:
a sensor circuit configured to detect activation of at least one circulator arranged to circulate liquid from a boiler through at least one circulation loop and back to the boiler;
an analog up/down timer circuit having an input coupled to an output of the sensor circuit and configured to generate a variable threshold signal that varies as a function of an activation time of said at least one circulator;
a burner control circuit configured to receive the variable threshold signal from the analog up/down timer circuit and to generate an ignition control signal based at least in part on comparison of a temperature sensor signal of the boiler with the variable threshold signal; and
an ignition driver configured to receive the ignition control signal from the burner control circuit and to generate an ignition signal for a burner configured to burn fuel to heat the liquid in the boiler based at least in part on the ignition control signal;
wherein the ignition driver comprises a first relay circuit configured to control a state of a first switch arranged in series with an alternating-current control line of the burner based at least in part on the ignition signal.

11. The apparatus of claim 10 further comprising a fault driver comprising a second relay circuit configured to control a state of a second switch arranged in series with the first switch and the alternating-current control line of the burner based at least in part on a fault indication signal generated by a fault detection circuit.

12. A method comprising:
detecting activation of at least one circulator arranged to circulate liquid from a boiler through at least one circulation loop and back to the boiler;
generating a variable threshold signal that varies as a function of an activation time of said at least one circulator;
generating an ignition control signal based at least in part on comparison of a temperature sensor signal of the boiler with the variable threshold signal; and
generating an ignition signal for a burner configured to burn fuel to heat the liquid in the boiler based at least in part on the ignition control signal;
wherein said at least one circulator comprises a plurality of circulators and generating the variable threshold signal comprises:
charging a charge storage element in a charge mode of operation for a period of time for which at least one of the plurality of circulators is activated; and
discharging the charge storage element in a discharge mode of operation for a period of time for which none of the plurality of circulators is activated.

13. The method of claim 12 wherein
the charge storage element is charged via a charge pump in the charge mode of operation and
the charge storage element is discharged via a discharge pump in the discharge mode of operation.

14. The method of claim 12 further comprising:
generating the temperature sensor signal as a first temperature sensor voltage indicative of a temperature of the liquid in the boiler; and
generating a second temperature sensor voltage also indicative of a temperature of the liquid in the boiler.

15. The method of claim 14 further comprising:
monitoring the first and second temperature sensor voltages; and
generating a fault indication signal if the first and second temperature sensor voltages differ from one another by more than a designated amount.

16. A method comprising:
detecting activation of at least one circulator arranged to circulate liquid from a boiler through at least one circulation loop and back to the boiler;
generating a variable threshold signal that varies as a function of an activation time of said at least one circulator;
generating an ignition control signal based at least in part on comparison of a temperature sensor signal of the boiler with the variable threshold signal; and
generating an ignition signal for a burner configured to burn fuel to heat the liquid in the boiler based at least in part on the ignition control signal;
wherein said at least one circulator comprises a plurality of circulators and detecting activation of at least one circulator comprises sensing current in respective alternating-current control lines of the plurality of circulators.

17. A method comprising:
detecting activation of at least one circulator arranged to circulate liquid from a boiler through at least one circulation loop and back to the boiler;
generating a variable threshold signal that varies as a function of an activation time of said at least one circulator;
generating an ignition control signal based at least in part on comparison of a temperature sensor signal of the boiler with the variable threshold signal;
generating an ignition signal for a burner configured to burn fuel to heat the liquid in the boiler based at least in part on the ignition control signal; and
controlling a state of a first switch arranged in series with an alternating-current control line of the burner based at least in part on the ignition signal.

18. The method of claim 17 further comprising controlling a state of a second switch arranged in series with the first switch and the alternating-current control line of the burner based at least in part on a fault indication signal.

19. A heating system comprising:
a boiler;
a burner configured to burn fuel to heat liquid in the boiler;
at least one circulation loop;
at least one circulator configured to circulate liquid from the boiler through said at least one circulation loop and back to the boiler;
a sensor circuit configured to detect activation of said at least one circulator;
an analog up/down timer circuit having an input coupled to an output of the sensor circuit and configured to generate a variable threshold signal that varies as a function of an activation time of said at least one circulator;
a burner control circuit configured to receive the variable threshold signal from the analog up/down timer circuit and to generate an ignition control signal based at least in part on comparison of a temperature sensor signal of the boiler with the variable threshold signal; and
an ignition driver configured to receive the ignition control signal from the burner control circuit and to generate an ignition signal for the burner based at least in part on the ignition control signal;
wherein said at least one circulator comprises a plurality of circulators; and
wherein the analog up/down timer circuit is configured to generate the variable threshold signal at least in part by being configured:
to charge a charge storage element in a charge mode of operation for a period of time for which at least one of the plurality of circulators is activated; and
to discharge the charge storage element in a discharge mode of operation for a period of time for which none of the plurality of circulators is activated.

20. The system of claim 19 wherein the analog up/down timer circuit comprises:
a pulse source;
the charge storage element;
a charge pump coupled between the pulse source and the charge storage element; and
a discharge pump coupled between the pulse source and the charge storage element;
wherein a pulse signal generated by the pulse source is utilized to charge the charge storage element via the charge pump in a charge mode of operation for a period of time for which at least one of the plurality of circulators is activated and to discharge the charge storage element via the discharge pump in a discharge mode of operation for a period of time for which none of the plurality of circulators is activated.

\* \* \* \* \*